US011573671B2

(12) United States Patent
Hyun et al.

(10) Patent No.: US 11,573,671 B2
(45) Date of Patent: Feb. 7, 2023

(54) TOUCH SENSING UNIT INCLUDING CONNECTION LINE COUPLED TO MULTIPLE BLOCKS OF TOUCH SENSING ELECTRODES AND DISPLAY DEVICE INCLUDING THE SAME

(71) Applicant: Samsung Display Co., Ltd., Yongin-si (KR)

(72) Inventors: Changho Hyun, Seoul (KR); Jeehyun Lee, Hwaseong-si (KR); Ahnho Jee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/403,796

(22) Filed: Aug. 16, 2021

(65) Prior Publication Data

US 2022/0035488 A1    Feb. 3, 2022

Related U.S. Application Data

(62) Division of application No. 16/699,689, filed on Dec. 1, 2019, now Pat. No. 11,093,096.

(30) Foreign Application Priority Data

Jan. 2, 2019  (KR) ......................... 10-2019-0000419

(51) Int. Cl.
*G06F 3/044* (2006.01)
*G06F 3/041* (2006.01)
*H01L 27/32* (2006.01)

(52) U.S. Cl.
CPC .......... *G06F 3/0446* (2019.05); *G06F 3/0412* (2013.01); *G06F 3/0448* (2019.05); *H01L 27/323* (2013.01)

(58) Field of Classification Search
CPC .................................................... G06F 3/0446
See application file for complete search history.

(56) References Cited

U.S. PATENT DOCUMENTS 10,042,470 B2    8/2018  Shin et al.
10,185,434 B2    1/2019  Suzuki et al.
(Continued)

FOREIGN PATENT DOCUMENTS

CN    105955557    9/2016
CN    206619121    11/2017
(Continued)

OTHER PUBLICATIONS

Extended European Search Report dated May 4, 2020, in European Patent Application No. 20150045.1.
(Continued)

*Primary Examiner* — Chun-Nan Lin
(74) *Attorney, Agent, or Firm* — H.C. Park & Associates, PLC

(57) ABSTRACT

A touch sensing unit includes first sensing electrodes (FSEs), second sensing electrodes SSEs, first signal lines (FSLs), second signal lines (SSLs), and connection lines (CLs). The FSEs extend in a first direction (D1) and are arranged in a second direction (D2) intersecting the D1. The SSEs extend in the D2 and are arranged in the D1. The FSLs are connected to the FSEs, respectively. The SSLs are connected to the SSEs, respectively. The CLs are connected to the FSEs via the FSLs. The FSEs are grouped into blocks. Each of the blocks includes p FSEs of the FSEs, and p FSLs connected to the p FSEs, respectively, "p" being a natural number greater than one. A k-th CL of the CLs is connected to one of the FSEs of each of the blocks, "k" being a natural number. The FSEs connected to the k-th connection line have different sizes.

4 Claims, 19 Drawing Sheets

(56) References Cited

U.S. PATENT DOCUMENTS

| | | | |
|---|---|---|---|
| 2013/0206567 A1* | 8/2013 | Hong | G06F 3/0445 |
| | | | 200/600 |
| 2015/0116243 A1 | 4/2015 | Saitou et al. | |
| 2017/0045997 A1* | 2/2017 | Suzuki | G06F 3/0445 |
| 2018/0121019 A1* | 5/2018 | Lee | G06F 3/041662 |
| 2018/0129352 A1* | 5/2018 | Kim | G06F 3/0412 |

FOREIGN PATENT DOCUMENTS

| | | |
|---|---|---|
| EP | 3232303 | 10/2017 |
| KR | 10-1630500 | 6/2016 |
| KR | 10-2017-0016556 | 2/2017 |
| KR | 10-2018-0049460 | 5/2018 |
| TW | 201120716 | 6/2011 |

OTHER PUBLICATIONS

Examination Report dated Dec. 14, 2020, in European Patent Application No. 20150045.1.
Non-Final Office Action dated Nov. 27, 2020, in U.S. Appl. No. 16/699,689.
Notice of Allowance dated Apr. 14, 2021, in U.S. Appl. No. 16/699,689.

\* cited by examiner

TOUCH SENSING UNIT INCLUDING CONNECTION LINE COUPLED TO MULTIPLE BLOCKS OF TOUCH SENSING ELECTRODES AND DISPLAY DEVICE INCLUDING THE SAME

CROSS-REFERENCE TO RELATED APPLICATION

This application is a Division of U.S. patent application Ser. No. 16/699,689, filed Dec. 1, 2019, which issued as U.S. Pat. No. 11,093,096, which claims priority to and the benefit of Korean Patent Application No. 10-2019-0000419, filed Jan. 2, 2019, each of which is hereby incorporated by reference for all purposes as if fully set forth herein.

BACKGROUND

Field

Exemplary embodiments generally relate to a touch sensing unit and a display device including the same.

Discussion

Display devices for displaying images may be included in (or otherwise associated with) electronic devices for providing the images to users, such as smart phones, digital cameras, notebook computers, navigation systems, smart televisions, and the like. The display device may include a display panel for generating an image and an input unit (e.g., a keyboard, a mouse, a touch sensing unit, etc.).

The touch sensing unit may be disposed on the display panel and may sense a touch interaction (e.g., touch action, hovering action, etc.) of a user. A signal sensed from the touch sensing unit may be converted into an input signal. The display panel may provide an image corresponding to the input signal of the touch sensing unit to a user. The touch sensing unit may include a plurality of sensing electrodes disposed in an active area, and signal lines disposed in a non-active area outside (e.g., around) the active area. At least some of the signal lines may be connected to the sensing electrodes. As the number of the signal lines increases, an area (or size) of the non-active area in which the signal lines are disposed may increase and the number of pads connected to the signal lines may increase. Therefore, a manufacturing cost and/or time of the display device may increase.

The above information disclosed in this section is only for understanding the background of the inventive concepts, and, therefore, may contain information that does not form prior art.

SUMMARY

Some exemplary embodiments provide a touch sensing unit capable of reducing a manufacturing cost and/or time.

Some exemplary embodiments provide display device including a touch sensing unit capable of reducing a manufacturing cost and/or time.

Additional aspects will be set forth in the detailed description which follows, and, in part, will be apparent from the disclosure, or may be learned by practice of the inventive concepts.

According to some exemplary embodiments, a touch sensing unit includes first sensing electrodes, second sensing electrodes, first signal lines, second signal lines, and connection lines. The first sensing electrodes extend in a first direction and are arranged in a second direction intersecting the first direction. The second sensing electrodes extend in the second direction and are arranged in the first direction. The first signal lines are connected to the first sensing electrodes, respectively. The second signal lines are connected to the second sensing electrodes, respectively. The connection lines are connected to the first sensing electrodes via the first signal lines. The first sensing electrodes are grouped into blocks. Each of the blocks includes p first sensing electrodes of the first sensing electrodes, and p first signal lines connected to the p first sensing electrodes, respectively, "p" being a natural number greater than one. A k-th connection line of the connection lines is connected to one of the first sensing electrodes of each of the blocks, "k" being a natural number. The first sensing electrodes connected to the k-th connection line have different sizes from each other.

According to some exemplary embodiments, a touch sensing unit includes first sensing electrodes, second sensing electrodes, first signal lines, second signal lines, and connection lines. The first sensing electrodes extend in a first direction and are arranged in a second direction intersecting the first direction. The second sensing electrodes extend in the second direction and are arranged in the first direction. The first signal lines are connected to the first sensing electrodes, respectively. The second signal lines are connected to the second sensing electrodes, respectively. The connection lines are connected to the first sensing electrodes via the first signal lines. The first sensing electrodes are grouped into blocks. Each of the blocks includes p first sensing electrodes of the first sensing electrodes, and p first signal lines connected to the p first sensing electrodes, respectively, "p" being a natural number greater than one. A k-th connection line of the connection lines is connected to one of the first sensing electrodes of each of the blocks, "k" being a natural number. The first sensing electrodes connected to the k-th connection line form capacitances with at least some of the second sensing electrodes. The capacitances of the blocks are different from each other.

According to some exemplary embodiments, a display device includes a display panel and a touch sensing unit disposed on the display panel. The touch sensing unit includes first sensing electrodes, second sensing electrodes, first signal lines, second signal lines, and connection lines. The first sensing electrodes extend in a first direction and are arranged in a second direction intersecting the first direction. The second sensing electrodes extend in the second direction and are arranged in the first direction. The first signal lines are connected to the first sensing electrodes, respectively. The second signal lines are connected to the second sensing electrodes, respectively. The connection lines are connected to the first sensing electrodes via the first signal lines. The first sensing electrodes are grouped into blocks. Each of the blocks includes p first sensing electrodes of the first sensing electrodes, and p first signal lines connected to the p first sensing electrodes, respectively, "p" being a natural number greater than one. A k-th connection line of the connection lines is connected to one of the first sensing electrodes of each of the blocks, "k" being a natural number. The first sensing electrodes connected to the k-th connection line have different sizes from each other.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF THE ILLUSTRATED EMBODIMENTS

Figure 1:
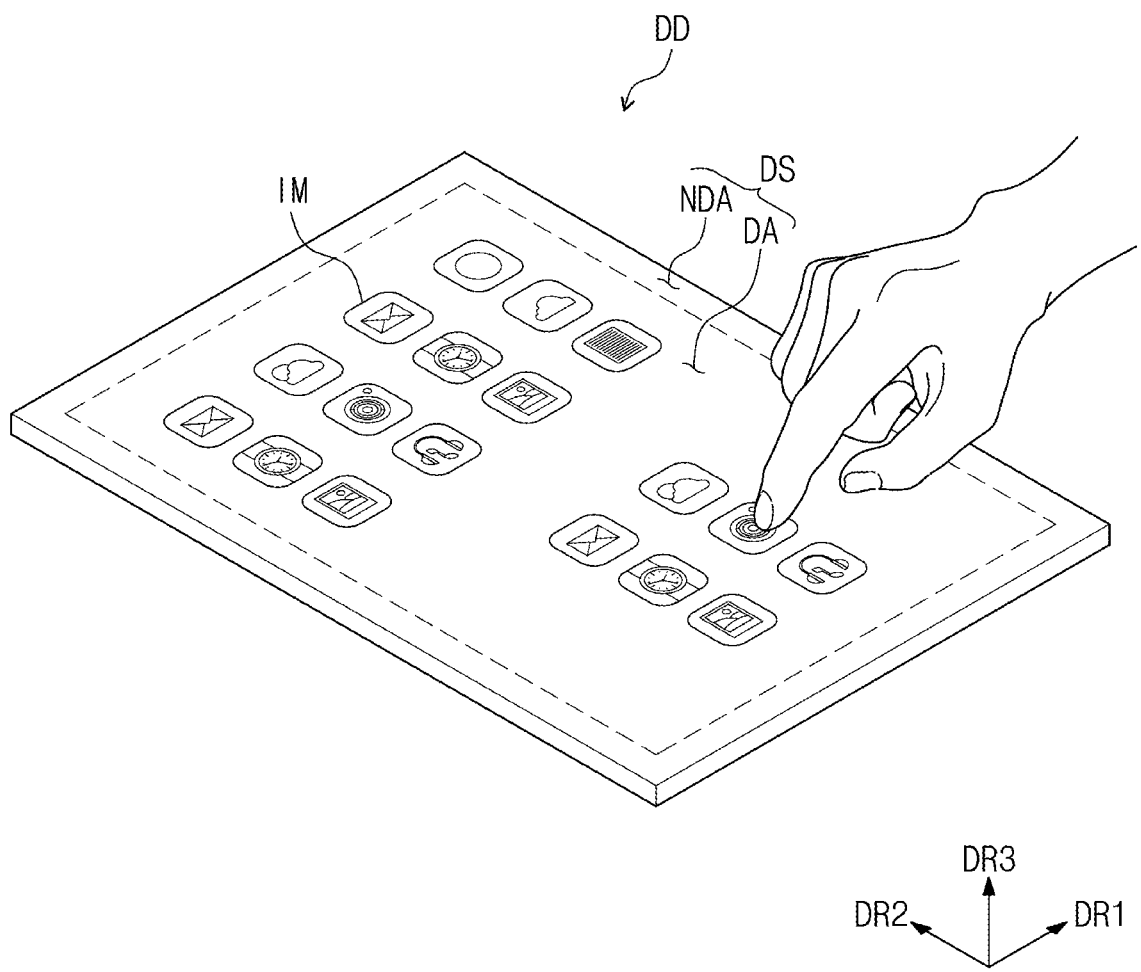
FIG. 1 is a perspective view illustrating a display device according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

FIG. 1 is a perspective view illustrating a display device according to some exemplary embodiments.

Referring to FIG. 1, a display device DD according to some exemplary embodiments may have a rectangular shape that has short sides in a first direction DR1 and long sides in a second direction DR2 intersecting the first direction DR1. However, exemplary embodiments are not limited thereto. In some exemplary embodiments, the display device DD may have one of other various shapes, such as a circular shape, a polygonal shape, an irregular shape, etc.

Hereinafter, a direction substantially perpendicular to a plane defined by the first and second directions DR1 and DR2 may be defined as a third direction DR3. In addition, the clause "when viewed in a plan view" as used herein may mean the clause "when viewed in the third direction DR3."

A top surface of the display device DD may be defined as a display surface DS and may have a flat surface defined by the first direction DR1 and the second direction DR2; however, exemplary embodiments are not limited thereto. An image IM generated by the display device DD may be provided to a user through the display surface DS.

The display surface DS may include a display area DA and a non-display area NDA outside (e.g., around) the display area DA. The display area DA may display an image (e.g., image IM), and the non-display area NDA may not display an image. The non-display area NDA may surround the display area DA in a plan view and may define a border of the display device DD that may be printed with a predetermined color.

The display device DD may be used in or with large-sized electronic devices, such as televisions, monitors, external billboards, etc. In some exemplary embodiments, the display device DD may be used in or with small and medium-sized electronic devices, such as personal computers, notebook computers, personal digital assistants, car navigation units, game consoles, smart phones, tablets, cameras, etc. However, these are provided only as exemplary embodiments. In some exemplary embodiments, the display device DD may be used in or with other electronic devices without departing from the spirit and scope of the inventive concepts.

Figure 2:
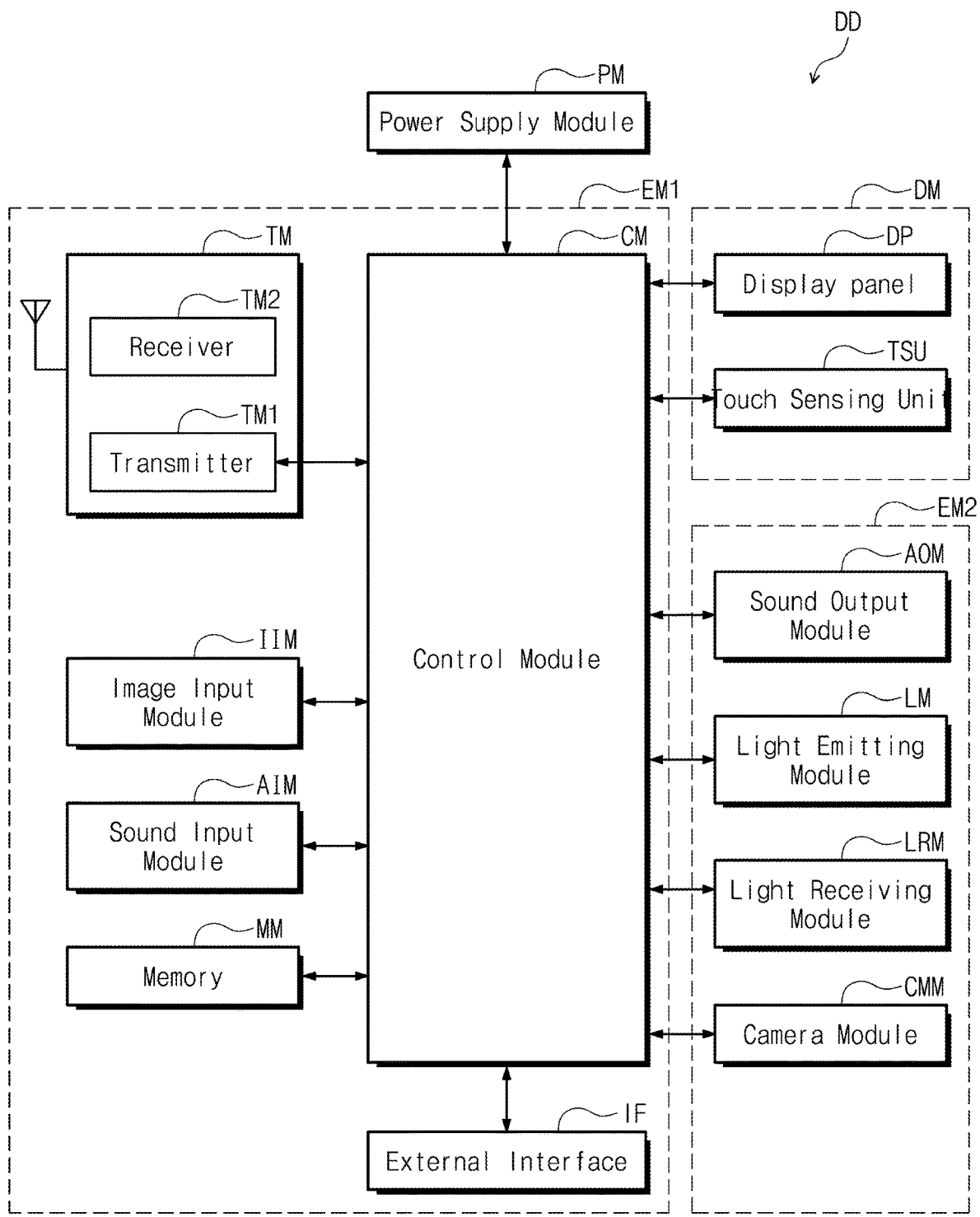
FIG. 2 is a block diagram of the display device illustrated in FIG. 1 according to some exemplary embodiments.

FIG. 2 is a block diagram of the display device illustrated in FIG. 1 according to some exemplary embodiments.

Referring to FIG. 2, the display device DD according to some exemplary embodiments may include a display module DM, a power supply module PM, a first electronic module EM1, and a second electronic module EM2. The display module DM, the power supply module PM, the first electronic module EM1, and the second electronic module EM2 may be electrically connected to each other.

The power supply module PM may supply power for overall operations of the display device DD. The power supply module PM may include a battery module, but exemplary embodiments are not limited thereto.

The first electronic module EM1 and the second electronic module EM2 may include various functional modules for operating the display device DD. The first electronic module EM1 may be mounted directly on a main board electrically connected to the display module DM. Alternatively, the first electronic module EM1 may be mounted on an additional board so as to be electrically connected to the main board through a connector (not shown).

The first electronic module EM1 may include a control module CM, a wireless communication module TM, an image input module IIM, a sound input module AIM, a memory MM, and an external interface IF. In some exemplary embodiments, some of the components (e.g., the modules) may not be mounted on the main board, but may be electrically connected to the main board through a flexible circuit board.

The control module CM may control overall operations of the display device DD. The control module CM may include a microprocessor. For example, the control module CM may activate or inactivate the display module DM. The control module CM may control other module(s) (e.g., the image input module IIM, the sound input module AIM, etc.) on the basis of a touch signal received from the display module DM.

The wireless communication module TM may transmit/receive a wireless signal to/from other terminal(s) using, for instance, Bluetooth™, Wi-Fi, or any other suitable communication protocol. The wireless communication module TM may transmit/receive a voice signal using a general communication line. The wireless communication module TM may include a transmitter TM1, which is configured to modulate a signal to be transmitted, and to transmit the modulated signal, and a receiver TM2, which is configured to demodulate a received signal.

The image input module TIM may process image signals to convert the image signals into image data usable in (or by) the display module DM. The sound input module AIM may receive an external sound signal through a microphone in a recording mode or a voice recognition mode, and may convert the received sound signal into electrical sound data.

The external interface IF may be connected to and interface with an external charger, a cable/wireless data port, and/or a card socket (e.g., a memory card or a subscriber identity module (SIM)/a user identity module (UIM) card).

The second electronic module EM2 may include a sound output module AOM, a light emitting module LM, a light receiving module LRM, and a camera module CMM. The components of the second electronic module EM2 may be mounted directly on the main board or may be mounted on an additional board so as to be electrically connected to the display module DM and/or the first electronic module EM1 through a connector (not shown).

The sound output module AOM may convert sound data received from the wireless communication module TM and/or sound data stored in the memory MM, and may output the converted sound data to the outside. The light emitting module LM may generate light and may output the generated light. For instance, the light emitting module LM may output infrared light. The light emitting module LM may include a light emitting diode (LED) element. The light receiving module LRM may sense infrared light. The light receiving module LRM may be activated when sensing the infrared light of a predetermined level or more. The light receiving module LRM may include a complementary metal-oxide-semiconductor (CMOS) sensor. After the infrared light generated in the light emitting module LM is output, the infrared light may be reflected by an external object (e.g., a finger, a face, etc., of a user), and the reflected infrared light may be incident to the light receiving module LRM. The camera module CMM may obtain an external image.

The display module DM may include a display panel DP and a touch sensing unit TSU. The display panel DP and the touch sensing unit TSU are illustrated as an example. However, in a some exemplary embodiments, the display module DM may further include a window. The display panel DP may display an image using image data provided from the control module CM. The touch sensing unit TSU may sense a touch interaction (e.g., an actual touch, a near touch, an approach, a hovering, and/or the like) of a user. A sensed touch signal may be converted into an input signal, and the input signal may be transmitted to the control module CM.

Figure 3:
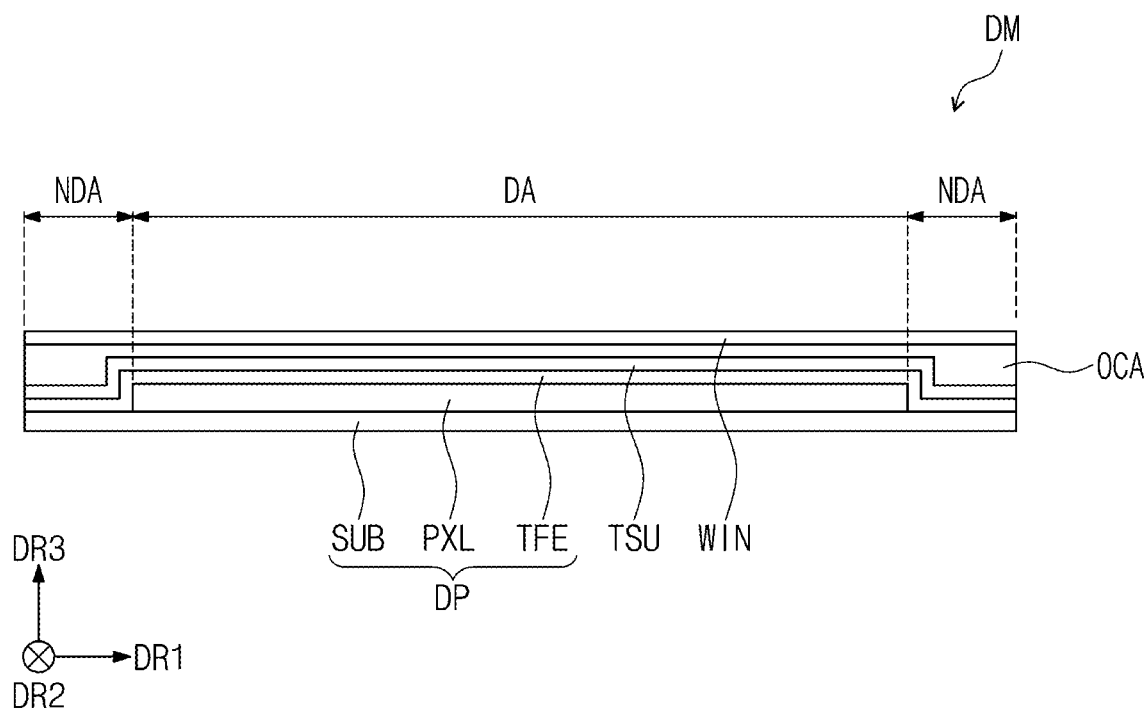
FIG. 3 is a cross-sectional view schematically illustrating a display module of FIG. 2 according to some exemplary embodiments.

FIG. 3 is a cross-sectional view schematically illustrating a display module of FIG. 2 according to some exemplary embodiments.

Referring to FIG. 3, the display module DM may include the display panel DP, the touch sensing unit TSU disposed on the display panel DP, a window WIN disposed on the touch sensing unit TSU, and an adhesive OCA disposed between the touch sensing unit TSU and the window WIN.

The display panel DP may be an organic light emitting display panel. However, exemplary embodiments are not limited thereto. In some exemplary embodiments, the display panel DP may be one of other various display panels capable of displaying images, such as a liquid crystal display panel, an electrowetting display panel, and an electrophoretic display panel.

The display panel DP may include a substrate SUB, a pixel layer PXL disposed on the substrate SUB, and a thin film encapsulation layer TFE disposed on the substrate SUB to cover the pixel layer PXL. The substrate SUB may be a transparent substrate and may include a flexible plastic substrate, but exemplary embodiments are not limited thereto. For example, the substrate SUB may include polyimide (PI).

The substrate SUB may include a display area DA and a non-display area NDA outside (e.g., around) the display area DA, like the display device DD. The pixel layer PXL may be disposed on the display area DA. As will become more apparent below, the pixel layer PXL may include a plurality of pixels, and each of the pixels may include a light emitting element.

The thin film encapsulation layer TFE may include at least two inorganic films and an organic film disposed between the inorganic films. The inorganic films may include an inorganic material and may protect the pixel layer PXL from moisture/oxygen. The organic film may include an organic material and may protect the pixel layer PXL from a foreign material, such as dust particles.

The touch sensing unit TSU may be disposed on the thin film encapsulation layer TFE. The touch sensing unit TSU may sense an external input (e.g., a user's hand, finger, etc., or a touch pen) and may convert the external input into an input signal. As will become more apparent below, the touch sensing unit TSU may include a plurality of sensing electrodes for sensing the external input. In some exemplary embodiments, the sensing electrodes may sense the external input by a capacitive method.

The touch sensing unit TSU may be manufactured directly on the thin film encapsulation layer TFE when the display module DM is manufactured, e.g., using one or more continuous processes without the use of an adhesive between the touch sensing unit TSU and the thin film encapsulation layer TFE. However, exemplary embodiments are not limited thereto. In some exemplary embodiments, the touch sensing unit TSU may be manufactured as a touch panel separate from the display panel DP and may be adhered to the display panel DP using an adhesive.

The window WIN may protect the display panel DP and the touch sensing unit TSU from external scratch and impact. The window WIN may be adhered to the touch sensing unit TSU using the adhesive OCA. The adhesive OCA may include an optical clear adhesive, but exemplary embodiments are not limited thereto. For instance, the adhesive OCA may include a pressure sensitive adhesive. An image generated from the display panel DP may be transmitted through the window WIN so as to be shown to a user.

Figure 4:
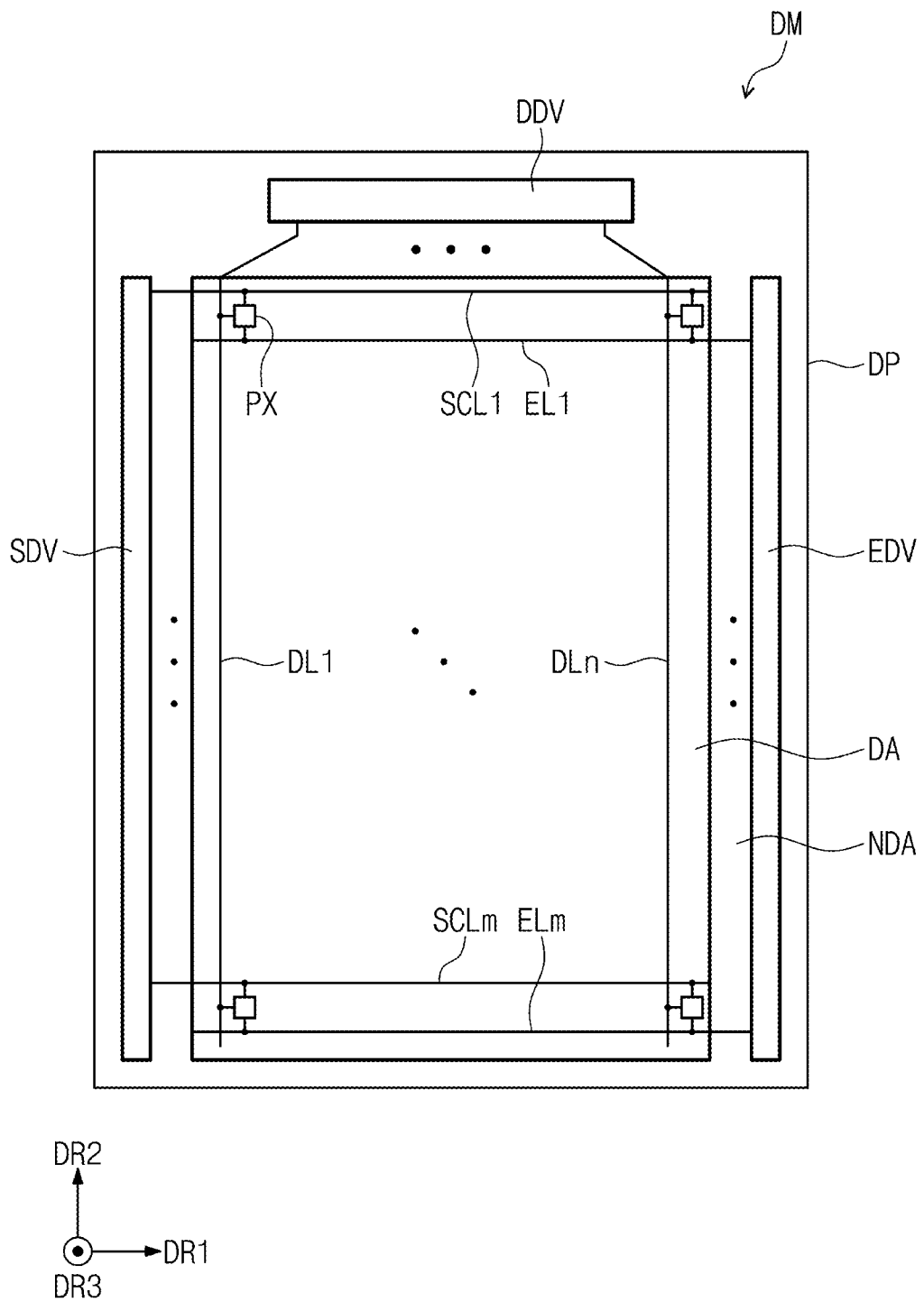
FIG. 4 is a plan view illustrating the display module of FIG. 3 according to some exemplary embodiments.

FIG. 4 is a plan view illustrating the display module of FIG. 3 according to some exemplary embodiments.

Referring to FIG. 4, the display module DM may include the display panel DP, a scan driver SDV, a data driver DDV, and an emission driver EDV. A planar configuration of the display panel DP is illustrated as an example in FIG. 4, and a planar configuration of the touch sensing unit TSU will be described later in more detail with reference to FIG. 9.

The display panel DP may be a flexible display panel. For example, the display panel DP may include a plurality of electronic elements disposed on a flexible substrate. The display panel DP may have a rectangular shape that has short sides in the first direction DR1 and long sides in the second direction DR2.

The display panel DP may have a plane defined by the first and second directions DR1 and DR2. The display panel DP may include the display area DA and the non-display area NDA surrounding the display area DA, like the display surface DS of the display device DD.

The display panel DP may include a plurality of pixels PX, a plurality of scan lines SCL1 to SCLm, a plurality of data lines DL1 to DLn, and a plurality of emission lines EL1 to ELm. Here, "m" and "n" are natural numbers. The pixels PX may be disposed in the display area DA and may be connected to the scan lines SCL1 to SCLm, the data lines DL1 to DLn, and the emission lines EL1 to ELm.

The scan driver SDV, the data driver DDV, and the emission driver EDV may be disposed in the non-display area NDA. The scan driver SDV may be disposed in the non-display area NDA adjacent to one side (e.g., one of the long sides) of the display panel DP. The emission driver EDV may be disposed in the non-display area NDA adjacent to another side, opposite to the one side, of the display panel DP. The data driver DDV may be manufactured in the form of an integrated circuit chip and may be disposed in the non-display area NDA adjacent to one of the short sides of the display panel DP.

The scan lines SCL1 to SCLm may extend in the first direction DR1, may be spaced apart from one another in the second direction DR2, and may be connected to the scan driver SDV. The data lines DL1 to DLn may extend in the second direction DR2, may be spaced apart from one another in the first direction DR1, and may be connected to the data driver DDV. The emission lines EL1 to ELm may extend in the first direction DR1, may be spaced apart from one another in the second direction DR2, and may be connected to the emission driver EDV.

The scan driver SDV may generate a plurality of scan signals, and the scan signals may be applied to the pixels PX through the scan lines SCL1 to SCLm. For instance, the scan signals may be applied sequentially to the pixels PX. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

Although not shown in the drawings, the display module DM may include a timing controller (not shown) for controlling operations of the scan driver SDV, the data driver DDV and the emission driver EDV. The timing controller may generate a scan control signal, a data control signal, and an emission control signal in response to control signals received from the outside. The timing controller may receive image signals from the outside and may convert a data format of the image signals to allow the converted data format of the image signals to match with interface specifications with the data driver DDV. The timing controller may provide the image signals, the data format of which is converted, to the data driver DDV.

The scan driver SDV may generate the scan signals in response to the scan control signal, and the emission driver EDV may generate the emission signals in response to the emission control signal. The data driver DDV may receive the image signals, the data format of which is converted, and may generate the data voltages corresponding to the image signals in response to the data control signal.

The pixels PX may receive the data voltages in response to the scan signals. The pixels PX may emit light of brightness corresponding to the data voltages in response to the emission signals, thereby displaying an image. Emission times of the pixels PX may be controlled by the emission signals.

Figure 5:
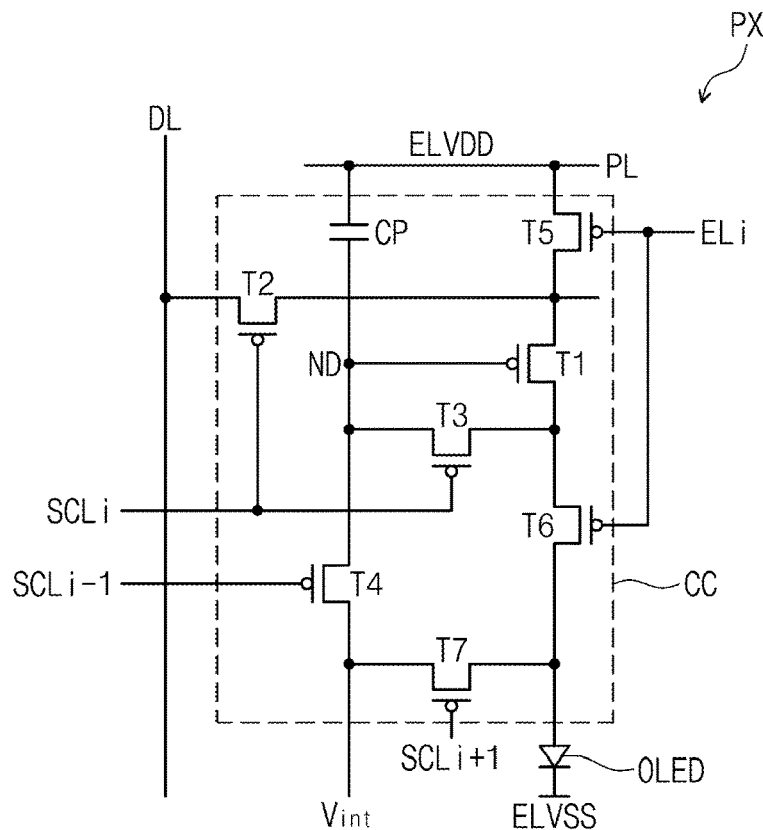
FIG. 5 is an equivalent circuit diagram illustrating a pixel of FIG. 4 according to some exemplary embodiments.
Figure 6:
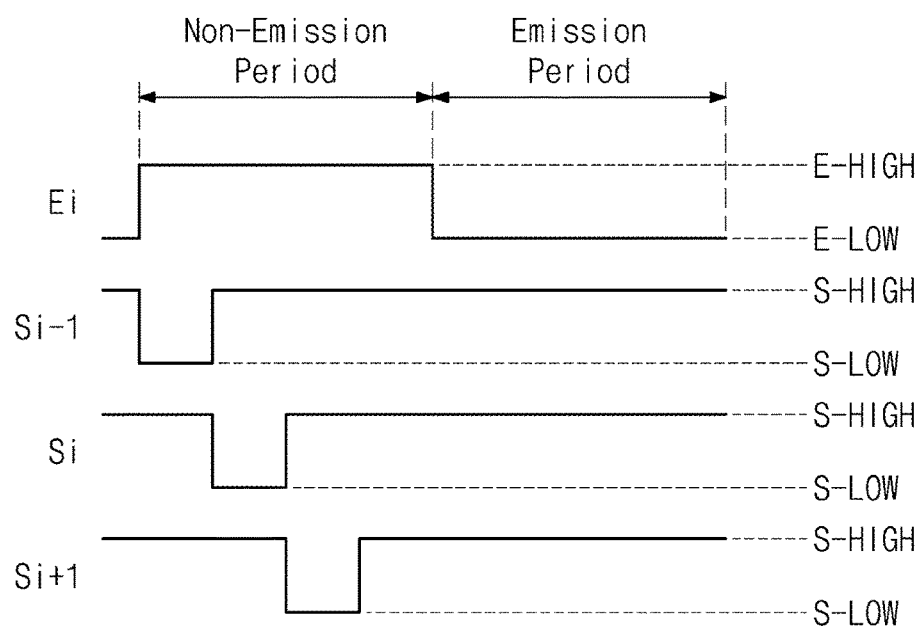
FIG. 6 is a diagram illustrating an emission signal and scan signals applied to the pixel of FIG. 5 according to some exemplary embodiments.

FIG. 5 is an equivalent circuit diagram illustrating a pixel of FIG. 4 according to some exemplary embodiments. FIG. 6 is a diagram illustrating an emission signal and scan signals applied to the pixel of FIG. 5 according to some exemplary embodiments.

A pixel PX connected to an i-th scan line SCLi and an i-th emission line ELi is illustrated as an example in FIG. 5.

The pixel PX may include an organic light emitting element OLED and a pixel circuit CC. The pixel circuit CC may include a plurality of transistors T1 to T7 and a capacitor CP. The pixel circuit CC may control the amount of a current flowing through the organic light emitting element OLED in response to a data signal.

The organic light emitting element OLED may emit light of a predetermined brightness in response to the amount of current provided from the pixel circuit CC. To achieve this, a level of a first power source ELVDD may be higher than a level of a second power source ELVSS.

Each of the plurality of transistors T1 to T7 may include an input electrode (or a source electrode), an output electrode (or a drain electrode), and a control electrode (or a gate electrode). For the purpose of ease and convenience in description, one of the input electrode and the output electrode may be referred to as a first electrode, and the other of the input electrode and the output electrode may be referred to as a second electrode.

The first electrode of a first transistor T1 may be connected to the first power source ELVDD via a fifth transistor T5, and the second electrode of the first transistor T1 may be connected to an anode electrode of the organic light emitting element OLED via a sixth transistor T6. The first transistor T1 may be referred to as a driving transistor. The first transistor T1 may control the amount of current flowing through the organic light emitting element OLED in response to a voltage applied to its control electrode.

A second transistor T2 may be connected between the data line DL and the first electrode of the first transistor T1. The control electrode of the second transistor T2 may be connected to the i-th scan line SCLi. When an i-th scan signal Si is provided to the i-th scan line SCLi, the second transistor T2 may be turned-on to electrically connect the data line DL to the first electrode of the first transistor T1.

A third transistor T3 may be connected between the control electrode and the second electrode of the first transistor T1. The control electrode of the third transistor T3 may be connected to the i-th scan line SCLi. When the i-th scan signal Si is provided to the i-th scan line SCLi, the third transistor T3 may be turned-on to electrically connect the control electrode and the second electrode of the first transistor T1. When the third transistor T3 is turned-on, the first transistor T1 may be connected in the form of a diode.

A fourth transistor T4 may be connected between a node ND and an initialization power generator (not shown). The control electrode of the fourth transistor T4 may be connected to an (i−1)-th scan line SCLi−1. When an (i−1)-th scan signal Si−1 is provided to the (i−1)-th scan line SCLi−1, the fourth transistor T4 may be turned-on to provide an initialization voltage Vint to the node ND.

A fifth transistor T5 may be connected between a power line PL and the first electrode of the first transistor T1. The control electrode of the fifth transistor T5 may be connected to the i-th emission line ELi.

A sixth transistor T6 may be connected between the second electrode of the first transistor T1 and the anode electrode of the organic light emitting element OLED. The control electrode of the sixth transistor T6 may be connected to the i-th emission line ELi.

A seventh transistor T7 may be connected between the initialization power generator (not shown) and the anode electrode of the organic light emitting element OLED. The control electrode of the seventh transistor T7 may be connected to an (i+1)-th scan line SCLi+1. When an (i+1)-th scan signal Si+1 is provided to the (i+1)-th scan line SCLi+1, the seventh transistor T7 may be turned-on to provide the initialization voltage Vint to the anode electrode of the organic light emitting element OLED.

The seventh transistor T7 may improve a black display capability of the pixel PX. For instance, when the seventh transistor T7 is turned-on, a parasitic capacitor (not shown) of the organic light emitting element OLED may be discharged. Accordingly, when black brightness is displayed, the organic light emitting element OLED may not emit light by a leakage current from the first transistor T1, and, thus, the black display capability may be improved.

In FIG. 5, the control electrode of the seventh transistor T7 is connected to the (i+1)-th scan line SCLi+1. However, exemplary embodiments are not limited thereto. In some exemplary embodiments, the control electrode of the seventh transistor T7 may be connected to the i-th scan line SCLi or the (i−1)-th scan line SCLi−1.

Although FIG. 5 illustrates p-type metal-oxide-semiconductor (PMOS) transistors as the transistors T1 to T7 in FIG. 5, exemplary embodiments are not limited thereto. In some exemplary embodiments, the pixel PX may include n-type metal-oxide-semiconductor (NMOS) transistors. In some exemplary embodiments, the pixel PX may include NMOS transistors and PMOS transistors.

The capacitor CP may be disposed between the power line PL and the node ND. The capacitor CP may store a voltage corresponding to the data signal. When the fifth and sixth transistors T5 and T6 are turned-on, the amount of a current flowing through the first transistor T1 may be determined depending on the voltage stored in the capacitor CP.

However, the structure of the pixel PX is not limited to the structure illustrated in FIG. 5. In some exemplary embodiments, the pixel PX may be realized in various forms (or structures) for operating the organic light emitting element OLED.

Referring to FIG. 6, an emission signal Ei may have a high level E-HIGH or a low level E-LOW. Each of the (i−1)-th, i-th, and (i+1)-th scan signals Si−1, Si, and Si+1 may have a high level S-HIGH or a low level S-LOW.

When the emission signal Ei has the high level E-HIGH, the fifth and sixth transistors T5 and T6 may be turned-off. When the fifth transistor T5 is turned-off, the power line PL may be electrically isolated from the first electrode of the first transistor T1. When the sixth transistor T6 is turned-off, the second electrode of the first transistor T1 may be electrically isolated from the anode electrode of the organic light emitting element OLED. Thus, the organic light emitting element OLED may not emit light during a period in which the emission signal Ei having the high level E-HIGH is provided to the i-th emission line ELi.

Thereafter, when the (i−1)-th scan signal Si−1 provided to the (i−1)-th scan line SCLi−1 has the low level S-LOW, the fourth transistor T4 may be turned-on. When the fourth transistor T4 is turned-on, the initialization voltage Vint may be provided to the node ND.

When the i-th scan signal Si provided to the i-th scan line SCLi has the low level S-LOW, the second and third transistors T2 and T3 may be turned-on. When the second transistor T2 is turned-on, the data signal may be provided to the first electrode of the first transistor T1. At this time, since the node ND is initialized by the initialization voltage Vint, the first transistor T1 may be turned-on. When the first transistor T1 is turned-on, a voltage corresponding to the data signal may be provided to the node ND. At this time, the capacitor CP may store the voltage corresponding to the data signal.

When the (i+1)-th scan signal Si+1 provided to the (i+1)-th scan line SCLi+1 has the low level S-LOW, the seventh transistor T7 may be turned-on. When the seventh transistor T7 is turned-on, the initialization voltage Vint may be provided to the anode electrode of the organic light emitting element OLED to discharge the parasitic capacitor of the organic light emitting element OLED.

When the emission signal Ei provided to the emission line ELi has the low level E-LOW, the fifth and sixth transistors T5 and T6 may be turned-on. When the fifth transistor T5 is turned-on, the first power source ELVDD may be provided to the first electrode of the first transistor T1. When the sixth transistor T6 is turned-on, the second electrode of the first transistor T1 may be electrically connected to the anode electrode of the organic light emitting element OLED. Thus, the organic light emitting element OLED may generate light of a predetermined brightness corresponding to the amount of the current provided to the organic light emitting element OLED.

Figure 7:
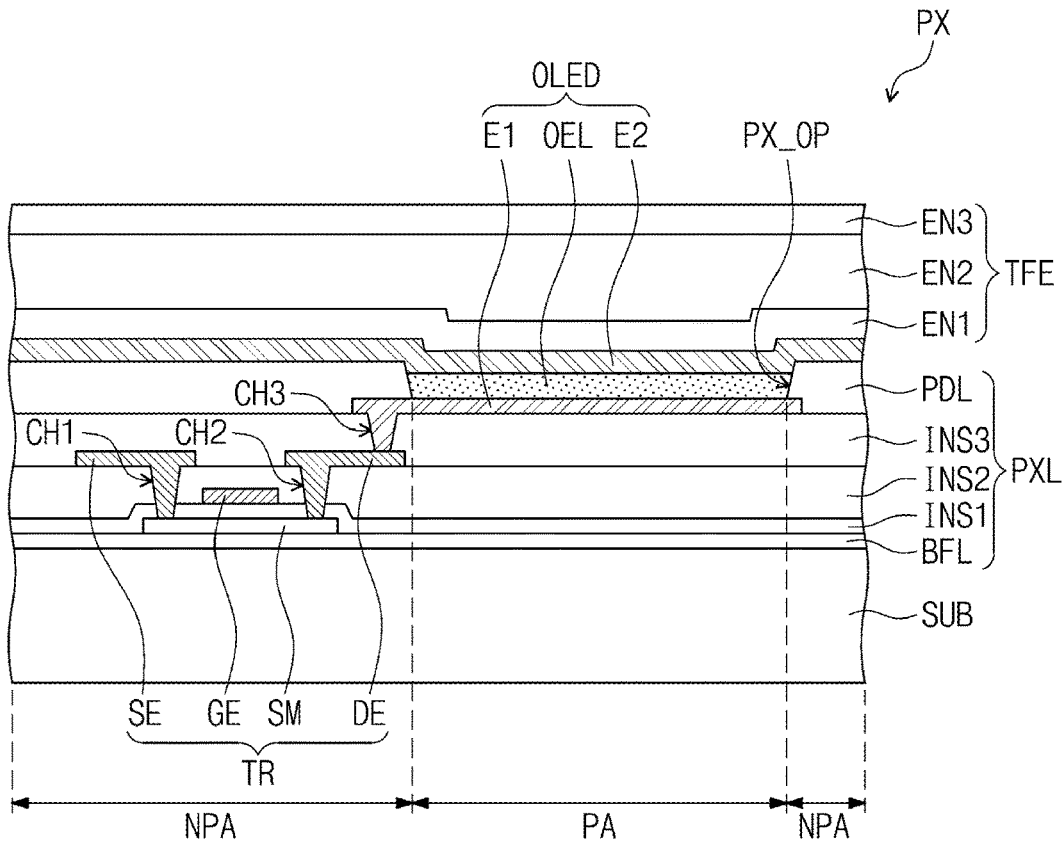
FIG. 7 is a cross-sectional view illustrating a portion corresponding to a light emitting element of FIG. 5 according to some exemplary embodiments.

FIG. 7 is a cross-sectional view illustrating a portion corresponding to a light emitting element of FIG. 5 according to some exemplary embodiments.

Referring to FIG. 7, the pixel PX may include an organic light emitting element OLED and a transistor TR connected to the organic light emitting element OLED. The organic light emitting element OLED may include a first electrode E1, a second electrode E2, and an organic emission layer OEL disposed between the first electrode E1 and the second electrode E2. The transistor TR may be the sixth transistor T6 illustrated in FIG. 5. The first electrode E1 may be an anode of the organic light emitting element OLED and the second electrode E2 may be a cathode of the organic light emitting element OLED.

The pixel PX may be divided into a pixel area PA and a non-pixel area NPA outside (e.g., around) the pixel area PA. The organic light emitting element OLED may be disposed in the pixel area PA, and the transistor TR may be disposed in the non-pixel area NPA.

The transistor TR and the organic light emitting element OLED may be disposed on the substrate SUB. A buffer layer BFL may be disposed on the substrate SUB. The buffer layer BFL may include an inorganic material. Although not shown, a barrier layer may be disposed between the buffer layer BFL and the substrate SUB or above the buffer layer BFL such that the buffer layer BFL is disposed between the barrier layer and the substrate SUB.

A semiconductor layer SM of the transistor TR may be disposed on the buffer layer BFL. The semiconductor layer SM may include an inorganic semiconductor material (e.g., amorphous silicon or polycrystalline silicon) or an organic semiconductor material, but exemplary embodiments are not limited thereto. For instance, the semiconductor layer SM may include an oxide semiconductor material. Although not shown in FIG. 7, the semiconductor layer SM may include a source region, a drain region, and a channel region between the source region and the drain region.

A first insulating layer INS1 may be disposed on the buffer layer BFL to cover the semiconductor layer SM. The first insulating layer INS1 may include an inorganic material. A gate electrode GE of the transistor TR may be disposed on the first insulating layer INS1 and may overlap with the semiconductor layer SM. The gate electrode GE may be disposed to overlap with the channel region of the semiconductor layer SM.

A second insulating layer INS2 may be disposed on the first insulating layer INS1 to cover the gate electrode GE. The second insulating layer INS2 may be defined as an interlayer insulating layer. The second insulating layer INS2 may include an organic material and/or an inorganic material.

A source electrode SE and a drain electrode DE of the transistor TR may be spaced apart from each other on the second insulating layer INS2. The source electrode SE may be connected to the source region of the semiconductor layer SM through a first contact hole CH1 penetrating the first and second insulating layers INS1 and INS2. The drain electrode DE may be connected to the drain region of the semiconductor layer SM through a second contact hole CH2 penetrating the first and second insulating layers INS1 and INS2.

A third insulating layer INS3 may be disposed on the second insulating layer INS2 to cover the source electrode SE and the drain electrode DE of the transistor TR. The third insulating layer INS3 may be defined as a planarization layer providing a flat (or planar) top surface and may include an organic material.

The first electrode E1 may be disposed on the third insulating layer INS3. The first electrode E1 may be connected to the drain electrode DE of the transistor TR through a third contact hole CH3 penetrating the third insulating layer INS3. The first electrode E1 may be defined as a pixel electrode. The first electrode E1 may include a transparent electrode and/or a reflective electrode.

A pixel defining layer PDL exposing a portion of the first electrode E1 may be disposed on the first electrode E1 and the third insulating layer INS3. An opening PX_OP exposing the portion of the first electrode E1 may be defined in the pixel defining layer PDL.

The organic emission layer OEL may be disposed on the first electrode E1 in the opening PX_OP. The organic emission layer OEL may generate one of red light, green light, and blue light; however, exemplary embodiments are not limited thereto. In some exemplary embodiments, the organic emission layer OEL may generate white light by a combination of organic materials generating red light, green light, and blue light.

The second electrode E2 may be disposed on the pixel defining layer PDL and the organic emission layer OEL. The second electrode E2 may be defined as a common electrode. The second electrode E2 may include a transparent electrode and/or a reflective electrode.

When the display panel DP is a front emission type organic light emitting display panel, the first electrode E1 may be the reflective electrode and the second electrode E2 may be the transparent electrode. When the display panel DP is a back emission type organic light emitting display panel, the first electrode E1 may be the transparent electrode and the second electrode E2 may be the reflective electrode. When the display panel DP is a front and back emission type organic light emitting display panel, the first electrode E1 may be the transparent electrode and the second electrode E2 may be the transparent electrode.

The thin film encapsulation layer TFE may be disposed on the organic light emitting element OLED to cover the pixel PX. The thin film encapsulation layer TFE may include a first encapsulation layer EN1 disposed on the organic light emitting element OLED, a second encapsulation layer EN2 disposed on the first encapsulation layer EN1, and a third encapsulation layer EN3 disposed on the second encapsulation layer EN2.

Each of the first and third encapsulation layers EN1 and EN3 may include an inorganic material, and the second encapsulation layer EN2 may include an organic material. A thickness of the second encapsulation layer EN2 may be greater than a thickness of each of the first and third encapsulation layers EN1 and EN3. A layer between the substrate SUB and the thin film encapsulation layer TFE may be defined as the pixel layer PXL.

A first voltage (e.g., the first power source) ELVDD may be applied to the first electrode E1, and a second voltage (e.g., the second power source) ELVSS may be applied to the second electrode E2. Holes and electrons injected in the organic emission layer OEL may be combined with each other to generate excitons, and the excitons may transition from an excited state to a ground state to emit light from the organic light emitting element OLED. The organic light emitting element OLED may emit one of the red light, the green light, and the blue light by a flow of the current, and, thus, an image may be displayed.

Figure 8:
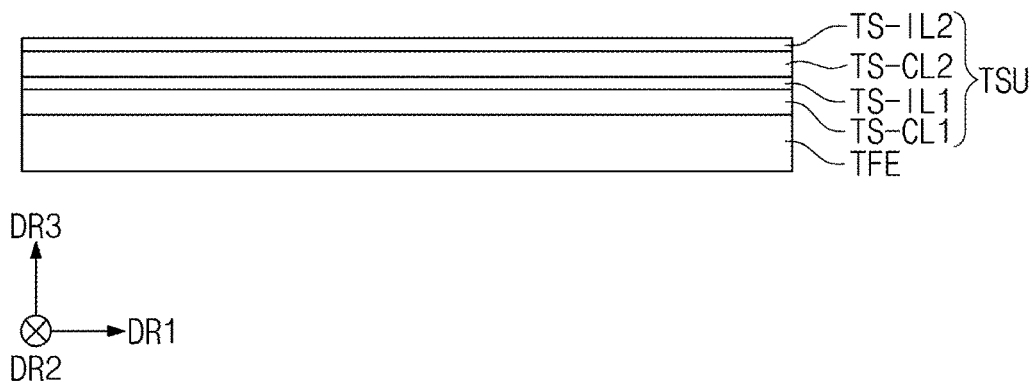
FIG. 8 is a cross-sectional view illustrating a touch sensing unit of FIG. 3 according to some exemplary embodiments.

FIG. 8 is a cross-sectional view illustrating a touch sensing unit of FIG. 3 according to some exemplary embodiments.

Referring to FIG. 8, the touch sensing unit TSU may include a first conductive layer TS-CL1, a first insulating layer TS-IL1 disposed on the first conductive layer TS-CL1, a second conductive layer TS-CL2 disposed on the first insulating layer TS-IL1, and a second insulating layer TS-IL2 disposed on the second conductive layer TS-CL2. The first conductive layer TS-CL1 may be disposed directly on the thin film encapsulation layer TFE. However, exemplary embodiments are not limited thereto. In some exemplary embodiments, a buffer layer may be disposed between the first conductive layer TS-CL1 and the thin film encapsulation layer TFE. The buffer layer may include an inorganic material or an organic material.

Each of the first and second conductive layers TS-CL1 and TS-CL2 may have a single-layered structure or may have a multi-layered structure including a plurality of layers stacked along (or in) the third direction DR3. A conductive layer having a multi-layered structure may include at least two of transparent conductive layers and metal layers. In some exemplary embodiments, a conductive layer having a multi-layered structure may include metal layers including different metals from each other.

A transparent conductive layer may at least one of include indium tin oxide (ITO), indium zinc oxide (IZO), zinc oxide (ZnO), indium tin zinc oxide (ITZO), poly(3,4-ethylenedioxythiophene) (PEDOT), metal nanowire, and graphene. The metal layer may include at least one of molybdenum, silver, titanium, copper, aluminum, and any alloy of at least one of the aforementioned materials.

In some exemplary embodiments, each of the first and second conductive layers TS-CL1 and TS-CL2 may include a plurality of conductive patterns. The first conductive layer TS-CL1 may include first conductive patterns, and the second conductive layer TS-CL2 may include second conductive patterns. The first conductive patterns and the second conductive patterns may include sensing electrodes and signal lines. The sensing electrodes and the signal lines will be described later in more detail.

Each of the first and second insulating layers TS-IL1 and TS-IL2 may have a single-layered or a multi-layered structure. Each of the first and second insulating layers TS-IL1 and TS-IL2 may include an inorganic material or an organic material.

The inorganic material may include at least one of aluminum oxide, titanium oxide, silicon oxide, silicon nitride, silicon oxynitride, zirconium oxide, and hafnium oxide. The organic material may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

Figure 9:
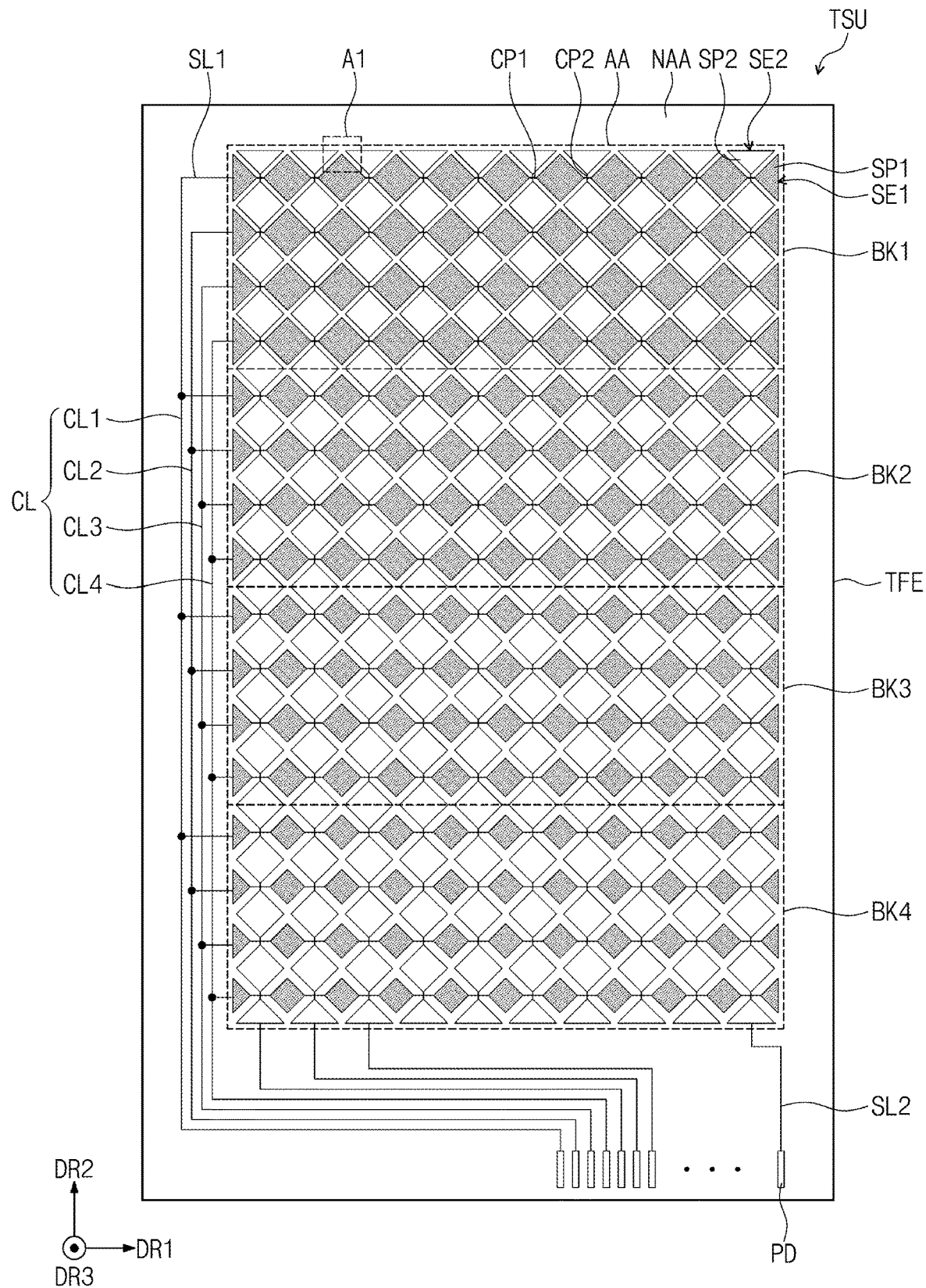
FIG. 9 is a plan view illustrating the touch sensing unit of FIG. 3 according to some exemplary embodiments.

FIG. 9 is a plan view illustrating a touch sensing unit of FIG. 3 according to some exemplary embodiments.

Referring to FIG. 9, the touch sensing unit TSU may include a plurality of sensing electrodes SE1 and SE2, a plurality of lines SL1, SL2, and CL, and a plurality of pads PD. The sensing electrodes SE1 and SE2, the lines SL1, SL2, and CL, and the pads PD may be disposed on the thin film encapsulation layer TFE. The sensing electrodes SE1 and SE2 and the lines SL1, SL2, and CL may be formed by the first and second conductive patterns described above.

The touch sensing unit TSU may include an active area AA and a non-active area NAA outside (e.g., surrounding) the active area AA when viewed in a plan view. The sensing electrodes SE1 and SE2 may be disposed in the active area AA, and the pads PD may be disposed in the non-active area NAA. The lines SL1, SL2, and CL may be connected to the sensing electrodes SE1 and SE2 and may extend into the non-active area NAA so as to be connected to the pads PD.

Although not shown in the drawings, the pads PD may be connected to a driving unit of the display device DD for driving the touch sensing unit TSU through, for instance, a flexible printed circuit board.

The sensing electrodes SE1 and SE2 may include a plurality of first sensing electrodes SE1 extending in the first direction DR1 and arranged in the second direction DR2, and a plurality of second sensing electrodes SE2 extending in the second direction DR2 and arranged in the first direction DR1. The lines SL1, SL2, and CL may include a plurality of first signal lines SL1 connected to the first sensing electrodes SE1, a plurality of second signal lines SL2 connected to the second sensing electrodes SE2, and a plurality of connection lines CL connected to the first signal lines SL1.

The second sensing electrodes SE2 may be insulated from the first sensing electrodes SE1 and may intersect the first sensing electrodes SE1. The first sensing electrodes SE1 may be defined as output sensing electrodes, and the second sensing electrodes SE2 may be defined as input sensing electrodes. The first signal lines SL1 and the connection lines CL may be defined as output signal lines, and the second signal lines SL2 may be defined as input signal lines.

Capacitances may be formed by the first sensing electrodes SE1 and the second sensing electrodes SE2. The capacitances will be described later in more detail with reference to FIGS. 13 to 16. Positions of the first and second sensing electrodes SE1 and SE2 may be indicated by X and Y coordinates; however, exemplary embodiments are not limited thereto. As an example, however, the first sensing electrodes SE1 may indicate Y coordinates, and the second sensing electrodes SE2 may indicate X coordinates. An X-axis having the X coordinates may be parallel to the first direction DR1, and a Y-axis having the Y coordinates may be parallel to the second direction DR2.

The active area AA may include a plurality of blocks BK1 to BK4. The blocks BK1 to BK4 may extend in the first direction DR1 and may be arranged in the second direction DR2.

The first sensing electrodes SE1 may be grouped into the plurality of blocks BK1 to BK4. For example, each of the blocks BK1 to BK4 may include p first sensing electrodes SE1 of the first sensing electrodes SE1 and p first signal lines SL1 connected to the p first sensing electrodes SE1, respectively. Here, "p" is a natural number greater than 1.

The blocks BK1 to BK4 may include first to fourth blocks BK1 to BK4. Four blocks BK1 to BK4 are illustrated as an example. However, the number of the blocks BK1 to BK4 is not limited thereto. In addition, each of the blocks BK1 to BK4 includes four first sensing electrodes SE1 and four first signal lines SL1 in FIG. 9. However, the numbers of the first sensing electrodes SE1 and the first signal lines SL1 included in each of the blocks BK1 to BK4 are not limited thereto.

Sizes of the first sensing electrodes SE1 of a h-th block of the blocks BK1 to BK4 may be different from sizes of the first sensing electrodes SE1 of a (h+1)-th block of the blocks BK1 to BK4. Here, "h" is a natural number. For example, the sizes of the first sensing electrodes SE1 of the h-th block may be greater than the sizes of the first sensing electrodes SE1 of the (h+1)-th block.

In other words, the sizes of the first sensing electrodes SE1 of the first block BK1 may be greater than the sizes of the first sensing electrodes SE1 of the second block BK2, the sizes of the first sensing electrodes SE1 of the second block BK2 may be greater than the sizes of the first sensing electrodes SE1 of the third block BK3, and the sizes of the first sensing electrodes SE1 of the third block BK3 may be greater than the sizes of the first sensing electrodes SE1 of the fourth block BK4. Thus, the sizes of the first sensing electrodes SE1 may decrease sequentially from the first block BK1 to the fourth block BK4 corresponding to the last block.

Sizes of the second sensing electrodes SE2 may be equal to each other. The sizes of the first sensing electrodes SE1 of the first block BK1 may be equal to the sizes of the second sensing electrodes SE2. The sizes of the first sensing electrodes SE1 of the second, third, and fourth blocks BK2, BK3, and BK4 may be smaller than the sizes of the second sensing electrodes SE2.

Each of the first sensing electrodes SE1 may include a plurality of first sensor portions SP1 arranged in the first direction DR1 and a plurality of first connecting portions CP1 connecting the first sensor portions SP1. The first sensor portions SP1 may have diamond shapes. However, the shapes of the first sensor portions SP1 are not limited thereto. Each of the first connecting portions CP1 may be disposed between two first sensor portions SP1 adjacent to each other to electrically connect the two first sensor portions SP1.

Each of the second sensing electrodes SE2 may include a plurality of second sensor portions SP2 arranged in the second direction DR2 and a plurality of second connecting portions CP2 connecting the second sensor portions SP2. The second sensor portions SP2 may have diamond shapes. However, the shapes of the second sensor portions SP2 are not limited thereto. Each of the second connecting portions CP2 may be disposed between two second sensor portions SP2 adjacent to each other to electrically connect the two second sensor portions SP2.

The first sensor portions SP1 and the second sensor portions SP2 may not overlap with each other, may be spaced apart from each other, and may be alternately disposed. The second connecting portions CP2 may be insulated from the first connecting portions CP1 and may intersect the first connecting portions CP1.

The first and second sensor portions SP1 and SP2 and the first connecting portions CP1 may be disposed on (or in) the same layer. The second connecting portions CP2 may be disposed on (or in) a different layer from the layer on which the first and second sensor portions SP1 and SP2 and the first connecting portions CP1 are disposed. For example, the second connecting portions CP2 may be formed of the first conductive patterns of the first conductive layer TS-CL1. The first and second sensor portions SP1 and SP2 and the first connecting portions CP1 may be formed of the second conductive patterns of the second conductive layer TS-CL2.

Sizes of the first sensor portions SP1 of the h-th block may be different from sizes of the first sensor portions SP1 of the (h+1)-th block. For example, the sizes of the first sensor portions SP1 of the h-th block may be greater than the sizes of the first sensor portions SP1 of the (h+1)-th block. The sizes of the first sensing electrodes SE1 may substantially mean the sizes of the first sensor portions SP1.

In other words, the sizes of the first sensor portions SP1 of the first block BK1 may be greater than the sizes of the first sensor portions SP1 of the second block BK2, the sizes of the first sensor portions SP1 of the second block BK2 may be greater than the sizes of the first sensor portions SP1 of the third block BK3, and the sizes of the first sensor portions SP1 of the third block BK3 may be greater than the sizes of the first sensor portions SP1 of the fourth block BK4. Thus, the sizes of the first sensor portions SP1 may decrease sequentially from the first block BK1 to the fourth block BK4.

The first signal lines SL1 may be connected to ends of the first sensing electrodes SE1, respectively, and may extend into the non-active area NAA. The connection lines CL may be disposed in the non-active area NAA and may be connected to the first signal lines SL1. The second signal lines SL2 may be connected to ends of the second sensing electrodes SE2, respectively, and may extend into the non-active area NAA. The connection lines CL and the second signal lines SL2 may be connected to the pads PD.

The connection lines CL may be connected to the first sensing electrodes SE1 through the first signal lines SL1. The first signal lines SL1 may extend in the first direction DR1. The connection lines CL may be connected to the first signal lines SL1 and may extend in the second direction DR2.

The number of the connection lines CL may be less than the number of the first signal lines SL1. Each of the connection lines CL may be connected to e first signal lines SL1 of the first signal lines SL1. Here, "e" is a natural number greater than 1. For example, each of four connection lines CL1 to CL4 may be connected in common to four first signal lines SL1. However, exemplary embodiments are not limited thereto. In some exemplary embodiments, the number of the first signal lines SL1 connected to each of the connection lines CL may be variously set depending on a configuration of the display device DD.

A k-th connection line of the connection lines CL may be connected to one of the first signal lines SL1 of each of the blocks BK1 to BK4. Here, "k" is a natural number. For example, the k-th connection line may be connected to a k-th first signal line SL1 of each of the blocks BK1 to BK4.

According to some exemplary embodiments, the connection lines CL may include first to fourth connection lines CL1 to CL4. The first connection line CL1 may be connected to a first one of the first signal lines SL1 of each of the blocks BK1 to BK4, and the second connection line CL2 may be connected to a second one of the first signal lines SL1 of each of the blocks BK1 to BK4. The third connection line CL3 may be connected to a third one of the first signal lines SL1 of each of the blocks BK1 to BK4, and the fourth connection line CL4 may be connected to a fourth one of the first signal lines SL1 of each of the blocks BK1 to BK4. It is noted, however, that exemplary embodiments are not limited thereto. In some exemplary embodiments, the k-th connection line may be connected to another first signal line SL1, except the k-th first signal line SL1, of each of the blocks BK1 to BK4.

If the connection lines CL are not used, the first signal lines SL1 may extend further than the connection lines CL into the non-active area NAA so as to be connected to the pads PD. In this manner, a size (or area) of the non-active area NAA in which the first signal lines SL1 are disposed may be increased. In addition, the number of the pads PD connected to the first signal lines SL1 may be more than when the connection lines CL are used.

However, according to various exemplary embodiments, the connection lines CL, which are of a fewer number than the first signal lines SL1, may be used, and each of the connection lines CL may be connected in common to e first signal lines SL1. Thus, since the number of the lines disposed in the non-active area NAA is reduced, the size (or area) of the non-active area NAA may be reduced and the number of the pads PD connected to the lines may be reduced. As a result, a manufacturing cost and/or time of the display device DD may be reduced.

The k-th connection line may be connected to one of the first sensing electrodes SE1 of each of the blocks BK1 to BK4 through one of the first signal lines SL1 of each of the blocks BK1 to BK4. For example, the k-th connection line of the connection lines CL may be connected to a k-th first sensing electrode SE1 of the first sensing electrodes SE1 of each of the blocks BK1 to BK4 through the k-th first signal line SL1 of the first signal lines SL1 of each of the blocks BK1 to BK4.

The first sensing electrodes SE1 connected to the same connection line may have different sizes from each other. For example, as described above, the sizes of the first sensing electrodes SE1 of the h-th block may be different from the sizes of the first sensing electrodes SE1 of the (h+1)-th block. Thus, the first sensing electrodes SE1 connected to the k-th connection line may have different sizes from each other. The sizes of the first sensing electrodes SE1 connected to the k-th connection line may decrease sequentially from a top side to a bottom side of the touch sensing unit TSU (e.g., from the first block BK1 to the fourth block BK4).

Figure 10:
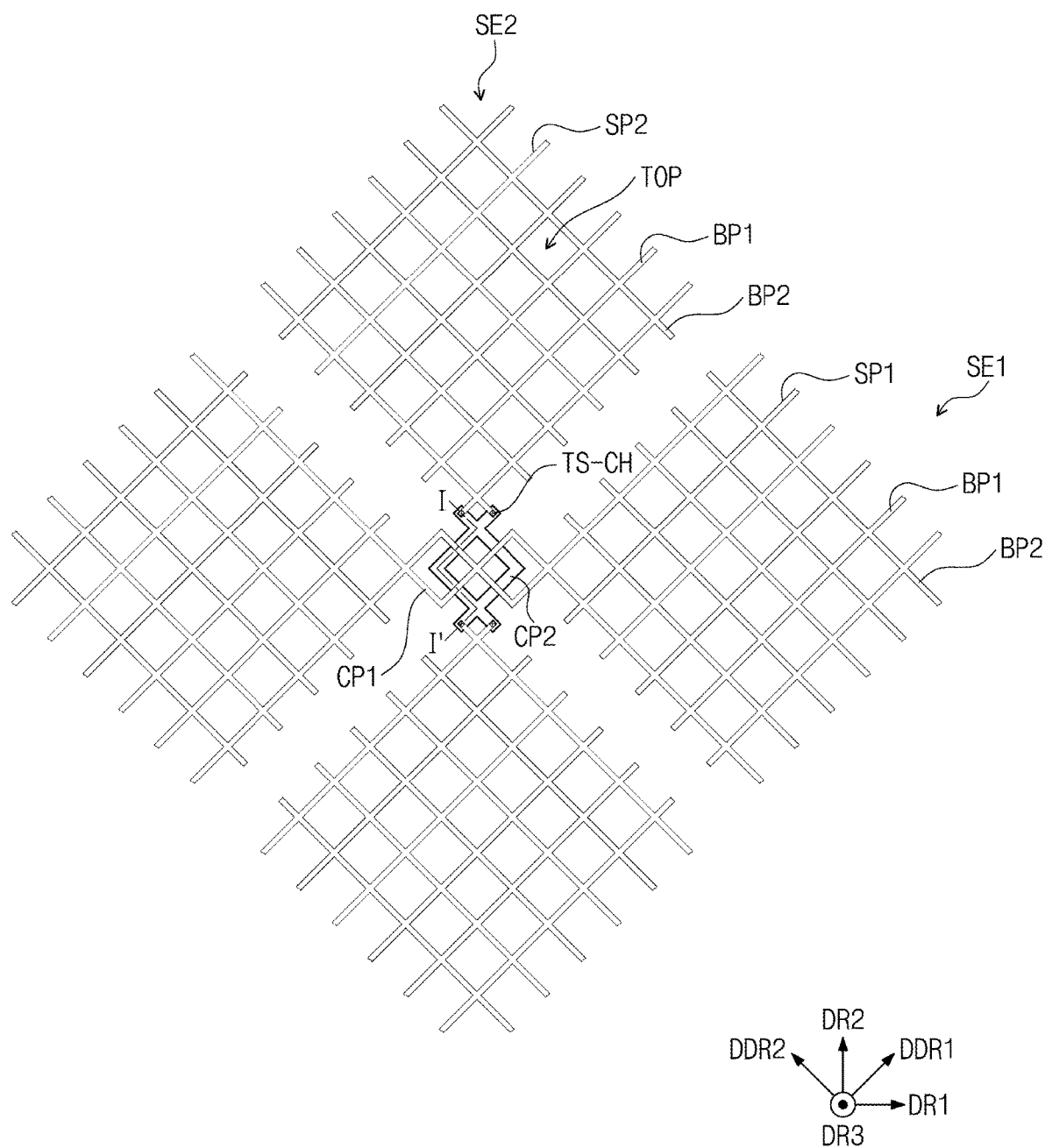
FIG. 10 is an enlarged plan view illustrating first and second sensor portions of FIG. 9 according to some exemplary embodiments.
Figure 11:
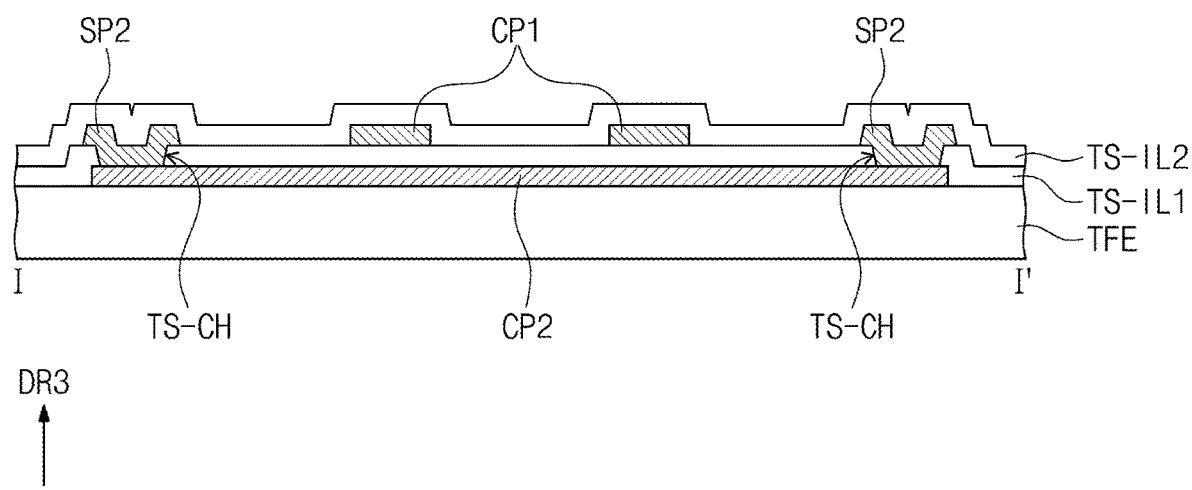
FIG. 11 is a cross-sectional view taken along sectional line I-I' of FIG. 10 according to some exemplary embodiments.

FIG. 10 is an enlarged plan view illustrating first and second sensor portions of FIG. 9 according to some exemplary embodiments. FIG. 11 is a cross-sectional view taken along sectional line I-I' of FIG. 10 according to some exemplary embodiments. For example, FIG. 10 illustrates two first sensor portions SP1 adjacent to each other and two second sensor portions SP2 adjacent to each other.

Referring to FIG. 10, the first and second sensor portions SP1 and SP2 may have mesh shapes. For example, each of the first and second sensor portions SP1 and SP2 may include a plurality of first branch portions BP1 extending in a first diagonal direction DDR1 and a plurality of second branch portions BP2 extending in a second diagonal direction DDR2.

The first diagonal direction DDR1 may be defined as a direction that intersects the first and second directions DR1 and DR2 in a plane defined by the first and second directions DR1 and DR2. The second diagonal direction DDR2 may be defined as a direction that intersects the first diagonal direction DDR1 in the plane defined by the first and second directions DR1 and DR2. For example, the first direction DR1 and the second direction DR2 may be perpendicular to each other, and the first diagonal direction DDR1 and the second diagonal direction DDR2 may be perpendicular to each other and different from each of the first direction DR1 and the second direction DR2.

The first branch portions BP1 and the second branch portions BP2 of each of the first and second sensor portions SP1 and SP2 may intersect each other and may be formed in a single unitary body. Openings TOP having diamond shapes may be defined by the first branch portions BP1 and the second branch portions BP2 intersecting each other. The first and second branch portions BP1 and BP2 may be defined as mesh lines, and a width of each of the mesh lines may be several micrometers.

The first sensor portions SP1 may be connected to each other by the first connecting portion CP1. Substantially, the first sensor portions SP1 and the first connecting portion CP1 may constitute a single unitary body. The first connecting portion CP1 may have a mesh shape and may extend from the first sensor portions SP1.

The second sensor portions SP2 may be electrically connected to each other by the second connecting portion CP2. The second connecting portion CP2 and the second sensor portions SP2 may not constitute a single unitary body. The second connecting portion CP2 may be connected to the second sensor portions SP2 through a plurality of contact holes TS-CH.

Referring to FIG. 11, the second connecting portion CP2 may be disposed on the thin film encapsulation layer TFE. The first insulating layer TS-IL1 may be disposed on the thin film encapsulation layer TFE to cover the second connecting portion CP2. The first connecting portion CP1 and the second sensor portions SP2 may be disposed on the first insulating layer TS-IL1. The first sensor portions SP1 formed with the first connecting portion CP1 as the single unitary body may also be disposed on the first insulating layer TS-IL1. The second insulating layer TS-IL2 may be disposed on the first insulating layer TS-IL1 to cover the first sensor portions SP1, the first connecting portion CP1, and the second sensor portions SP2.

The second connecting portion CP2 may be connected to the second sensor portions SP2 through the plurality of contact holes TS-CH defined in the first insulating layer TS-IL1. Both side portions of the second connecting portion CP2 may be connected to the second sensor portions SP2 through the contact holes TS-CH.

In various exemplary embodiments, the first and second sensor portions SP1 and SP2 and the first connecting portion CP1 are disposed in the same layer, and the second connecting portion CP2 is disposed in a different layer. However, exemplary embodiments are not limited thereto.

In some exemplary embodiments, the first sensor portions SP1 and the first connecting portion CP1 may be disposed in a same layer, and the second sensor portions SP2 and the second connecting portion CP2 may be disposed in a same layer. Here, the second sensor portions SP2 and the second connecting portion CP2 may be disposed in a layer different from the layer in which the first sensor portions SP1 and the first connecting portion CP1 are disposed. In this case, the first sensor portions SP1 and the first connecting portion CP1 may be formed by one of the first and second conductive layers TS-CL1 and TS-CL2, and the second sensor portions SP2 and the second connecting portion CP2 may be formed by the other of the first and second conductive layers TS-CL1 and TS-CL2.

Figure 12:
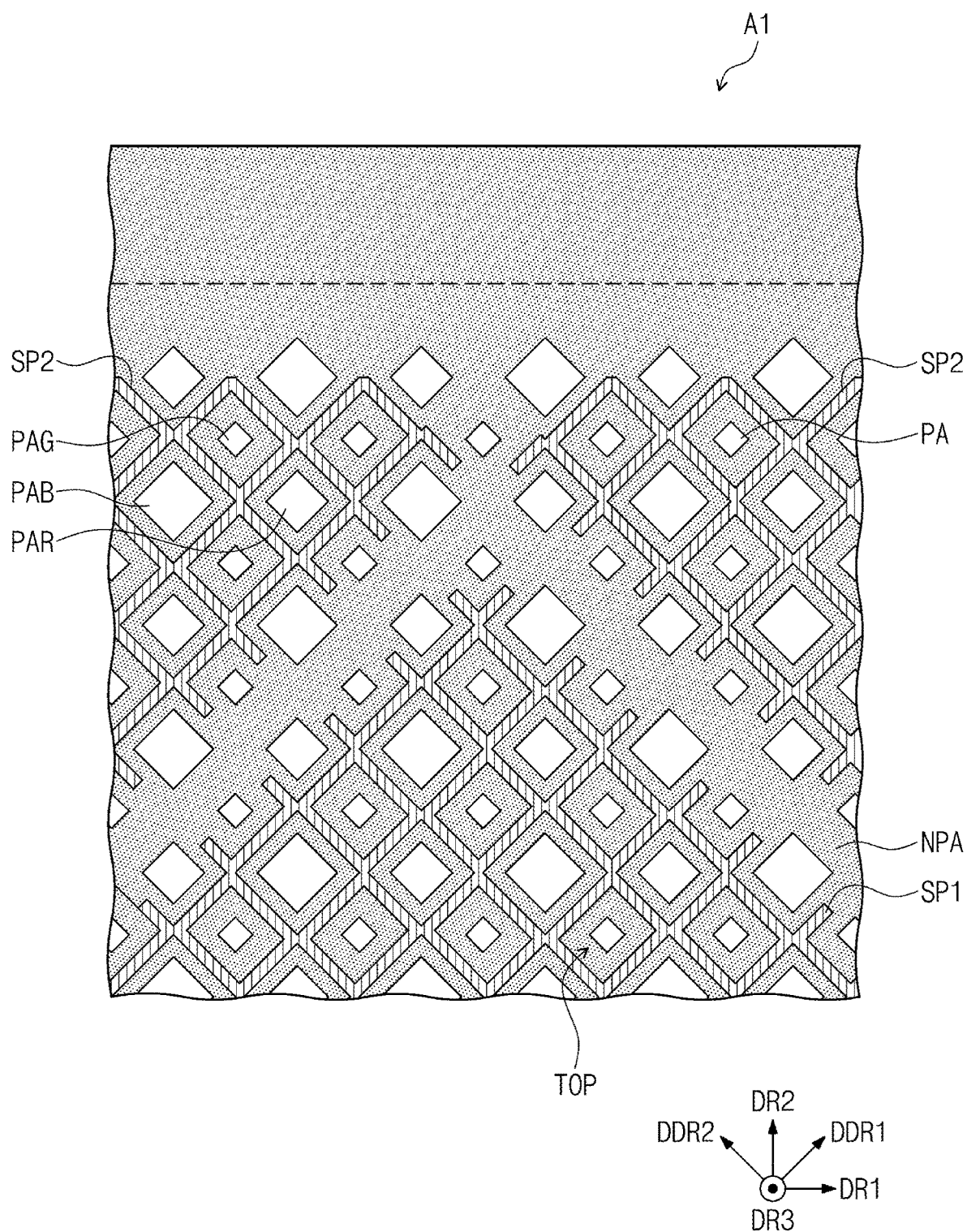
FIG. 12 is an enlarged view of a first area A1 illustrated in FIG. 9 according to some exemplary embodiments.

FIG. 12 is an enlarged view of a first area A1 illustrated in FIG. 9 according to some exemplary embodiments.

In FIG. 12, the first and second sensor portions SP1 and SP2 are illustrated in mesh shapes, like the first and second sensor portions SP1 and SP2 illustrated in FIG. 11. FIG. 12 is a view for explaining shapes of the pixels according to some exemplary embodiments. Thus, planar shapes of the pixels are illustrated together with the first and second sensor portions SP1 and SP2 in FIG. 12 for the purpose of ease and convenience in description.

Referring to FIG. 12, the pixels PX may include a plurality of pixel areas PA and a non-pixel area NPA around each of the pixel areas PA. Each of the pixel areas PA may be the pixel area PA illustrated in FIG. 7. Each of the pixel areas PA may be configured to display a red color, a green color, or a blue color. However, exemplary embodiments are not limited thereto. In some exemplary embodiments, the pixel areas PA may further include pixel areas, each of which is configured to display a magenta color, a cyan color, or a white color, or any other suitable color.

The pixel areas PA may have different sizes depending on the colors displayed thereby. For example, a blue pixel area PAB may be larger than a red pixel area PAR, and the red pixel area PAR may be larger than a green pixel area PAG; however, exemplary embodiments are not limited thereto.

The pixel areas PA may have diamond shapes. Alternatively, the pixel areas PA may have one or more of various shapes, such as circular shapes and/or polygonal shapes. The pixel areas PA may be arranged in the first diagonal direction DDR1 and the second diagonal direction DDR2.

The first and second sensor portions SP1 and SP2 having the mesh shapes may overlap with the non-pixel area NPA. The openings TOP may have diamond shapes corresponding to the shapes of the pixel areas PA and may have sizes corresponding to the sizes of the pixel areas PA.

The pixel areas PA may be defined as light emitting areas, and the non-pixel area NPA may be defined as a non-light emitting area. Since the first and second sensor portions SP1 and SP2 are disposed in the non-pixel area NPA, light generated from the pixel areas PA may be normally emitted without being affected by the first and second sensor portions SP1 and SP2.

Figure 13:
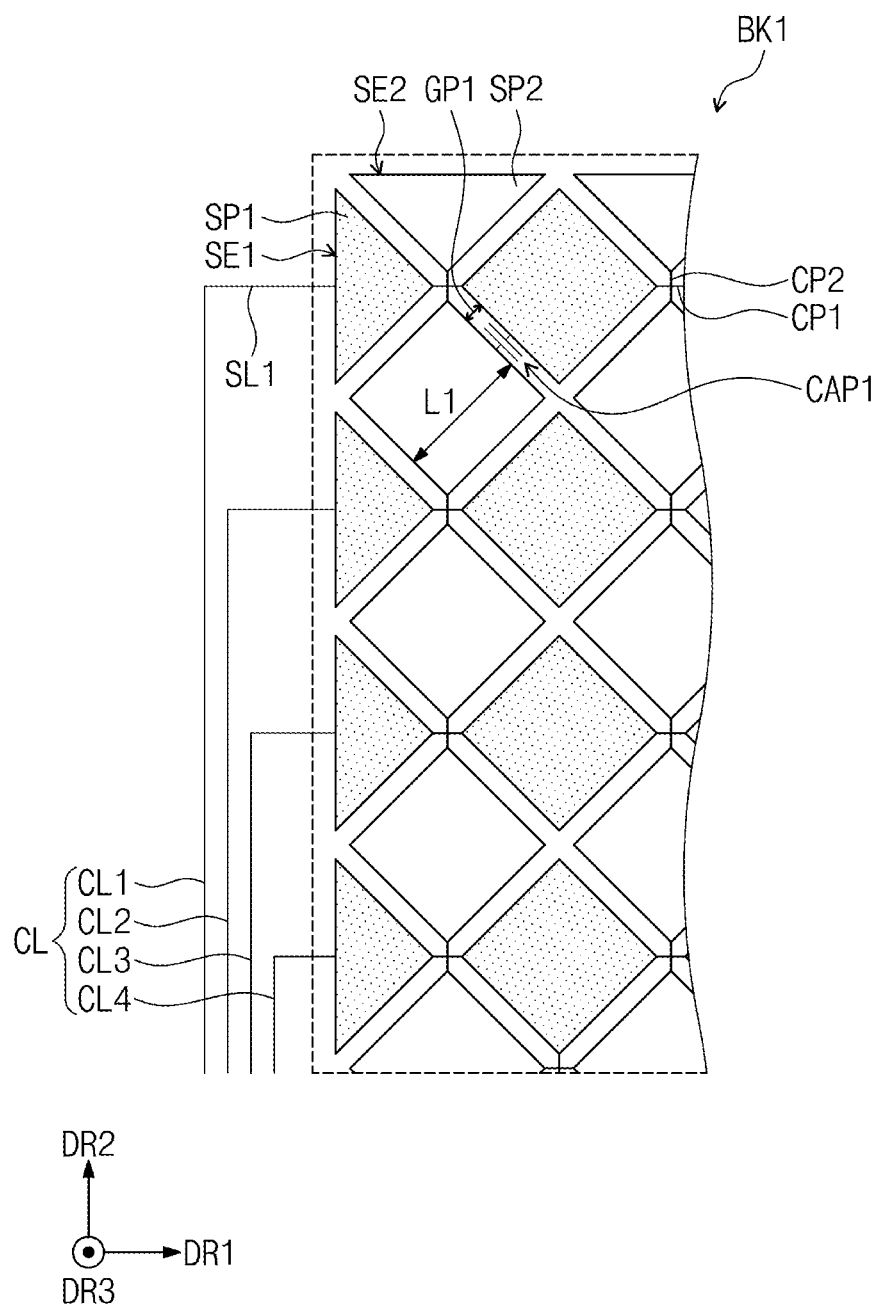
FIG. 13 is an enlarged view of a first block illustrated in FIG. 9 according to some exemplary embodiments.
Figure 14:
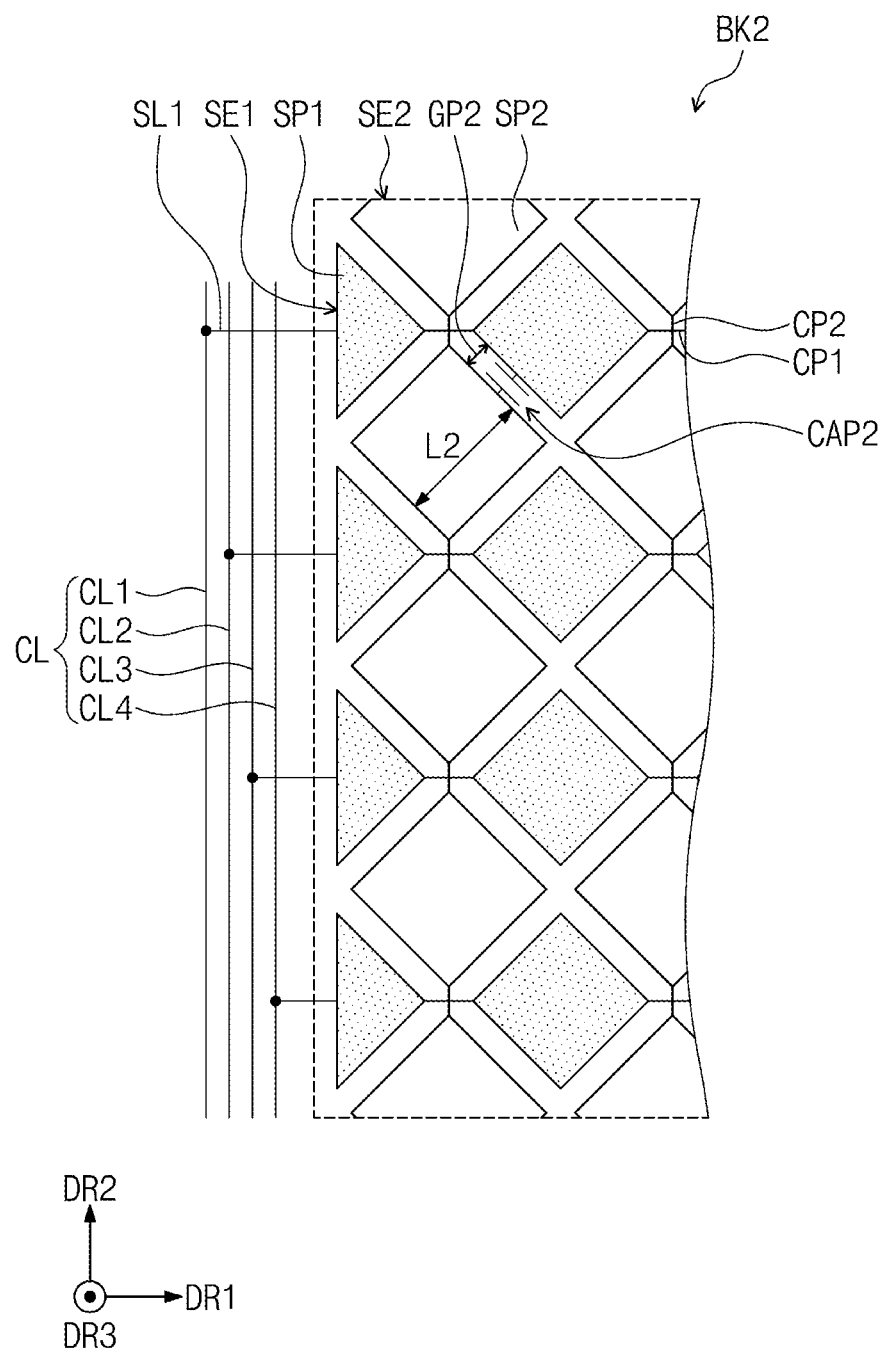
FIG. 14 is an enlarged view of a second block illustrated in FIG. 9 according to some exemplary embodiments.
Figure 15:
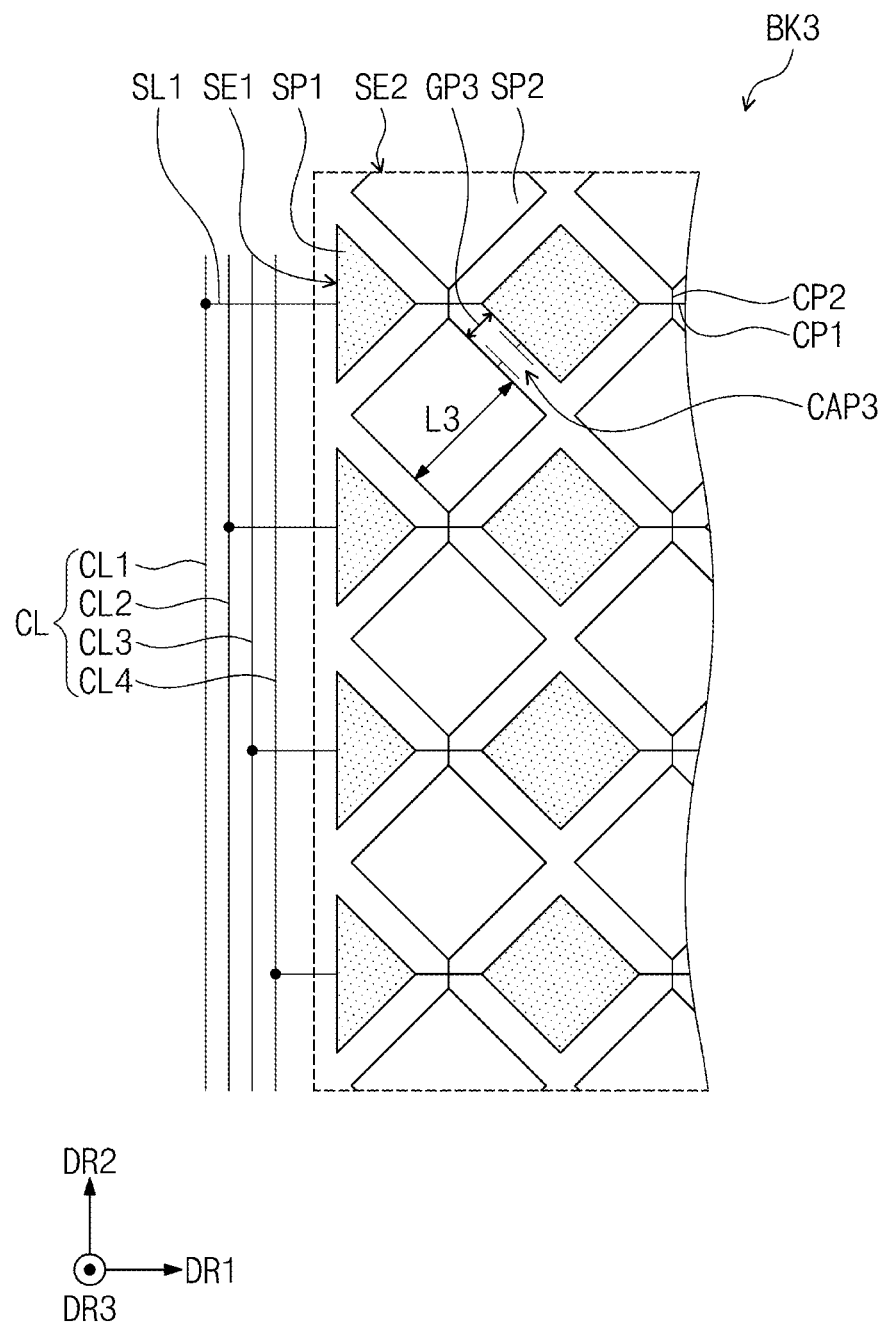
FIG. 15 is an enlarged view of a third block illustrated in FIG. 9 according to some exemplary embodiments.
Figure 16:
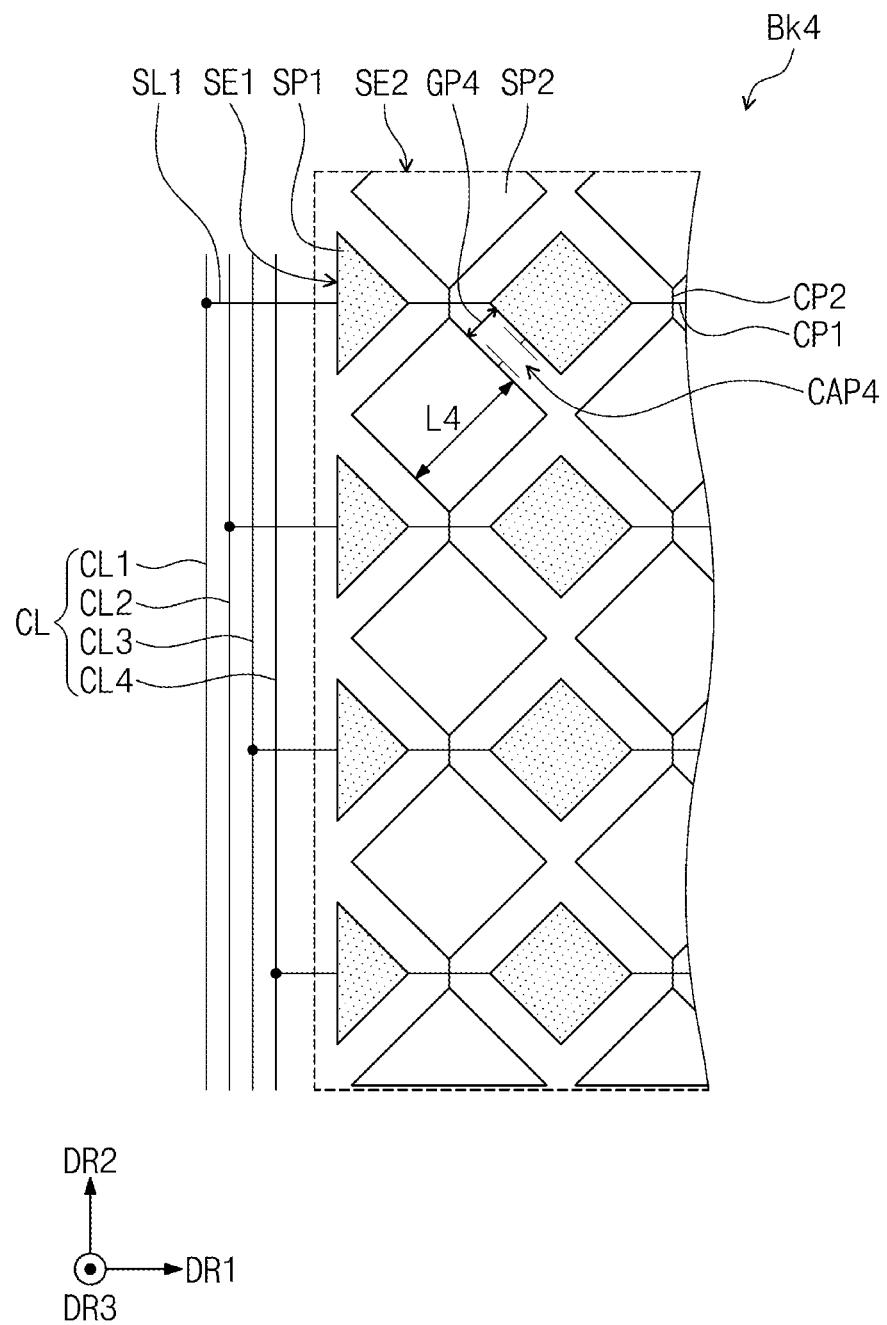
FIG. 16 is an enlarged view of a fourth block illustrated in FIG. 9 according to some exemplary embodiments.

FIG. 13 is an enlarged view of a first block illustrated in FIG. 9 according to some exemplary embodiments. FIG. 14 is an enlarged view of a second block illustrated in FIG. 9 according to some exemplary embodiments. FIG. 15 is an enlarged view of a third block illustrated in FIG. 9 according to some exemplary embodiments. FIG. 16 is an enlarged view of a fourth block illustrated in FIG. 9 according to some exemplary embodiments.

For the purpose of ease and convenience in description and illustration, FIGS. 13 to 16 illustrate enlarged views of portions of the first to fourth blocks BK1 to BK4, respectively. In each of the first to fourth blocks BK1 to BK4, the first sensor portions SP1 may have the same features and the second sensor portions SP2 may have the same features. Thus, features of the first sensor portion SP1 and the second sensor portion SP2 adjacent to each other in each of the blocks BK1 to BK4 will be described, hereinafter, as examples for the purpose of ease and convenience in description, but exemplary embodiments are not limited thereto.

Referring to FIG. 13, the first sensor portion SP1 may have the same size as the second sensor portion SP2 in the first block BK1. Here, the size may mean an area of each of the first and second sensor portions SP1 and SP2 when viewed in a plan view.

A distance between the first sensor portion SP1 and the second sensor portion SP2 may be defined as a first distance GP1. A length of one side of the first sensor portion SP1 may be defined as a first length L1. A first capacitance CAP1 may be formed by the first sensor portion SP1 and the second sensor portion SP2 spaced apart from each other.

Referring to FIG. 14, the size of the first sensor portion SP1 may be less than the size of the second sensor portion SP2 in the second block BK2. A distance between the first sensor portion SP1 and the second sensor portion SP2 may be defined as a second distance GP2, and the second distance GP2 may be greater than the first distance GP1. A length of one side of the first sensor portion SP1 may be defined as a second length L2, and the second length L2 may be less than the first length L1.

A second capacitance CAP2 may be formed by the first sensor portion SP1 and the second sensor portion SP2 spaced apart from each other. A capacitance may be proportional to areas of two electrodes spaced apart from each other and may be inversely proportional to a distance between the two electrodes. Thus, the second capacitance CAP2 may be less than the first capacitance CAP1.

Referring to FIG. 15, the size of the first sensor portion SP1 may be less than the size of the second sensor portion SP2 in the third block BK3. A distance between the first sensor portion SP1 and the second sensor portion SP2 may be defined as a third distance GP3, and the third distance GP3 may be greater than the second distance GP2.

A length of one side of the first sensor portion SP1 may be defined as a third length L3, and the third length L3 may be less than the second length L2. A third capacitance CAP3 may be formed by the first sensor portion SP1 and the second sensor portion SP2 spaced apart from each other. The third capacitance CAP3 may be less than the second capacitance CAP2.

Referring to FIG. 16, the size of the first sensor portion SP1 may be less than the size of the second sensor portion SP2 in the fourth block BK4. A distance between the first sensor portion SP1 and the second sensor portion SP2 may be defined as a fourth distance GP4, and the fourth distance GP4 may be greater than the third distance GP3.

A length of one side of the first sensor portion SP1 may be defined as a fourth length L4, and the fourth length L4 may be less than the third length L3. A fourth capacitance CAP4 may be formed by the first sensor portion SP1 and the second sensor portion SP2 spaced apart from each other. The fourth capacitance CAP4 may be less than the third capacitance CAP3.

Referring to FIGS. 13 to 16, with regard to the distance between the first sensor portion SP1 and the second sensor portion SP2, the distance between the first and second sensor portions SP1 and SP2 adjacent to each other in the h-th block may be less than the distance between the first and second sensor portions SP1 and SP2 adjacent to each other in the (h+1)-th block.

The first to fourth capacitances CAP1 to CAP4 may be formed by the first sensor portions SP1 and the second sensor portions SP2. In other words, the first to fourth capacitances CAP1 to CAP4 may be formed by the first sensing electrodes SE1 and the second sensing electrodes SE2. The capacitances of the h-th block may be different from the capacitances of the (h+1)-th block. For example, the capacitances of the h-th block may be greater than the capacitances of the (h+1)-th block. Thus, the capacitances CAP1 to CAP4 may decrease sequentially from the first block BK1 to the fourth block BK4.

Since the k-th connection line is connected to the k-th first sensing electrode SE1 of each of the first to fourth blocks BK1 to BK4 as described above, capacitances formed by the first sensing electrodes SE1 connected to the k-th connection line and the second sensing electrodes SE2 may be the first to fourth capacitances CAP1 to CAP4 and may be different from each other. For example, when "k" is 1, the first sensing electrodes SE1 of the first to fourth blocks BK1 to BK4 that are connected to the first connection line CL1 may form the first to fourth capacitances CAP1 to CAP4 with the second sensing electrodes SE2, respectively.

For example, the first to fourth capacitances CAP1 to CAP4 may have values of 1 picofarads (pF), (½) pF, (⅓) pF and (⅕) pF, respectively. However, exemplary embodiments are not limited thereto. In some exemplary embodiments, the values of the first to fourth capacitances CAP1 to CAP4 may be variously set depending on the sizes of the first sensor portions SP1 and/or the distances between the first sensor portions SP1 and the second sensor portions SP2.

Figure 17:
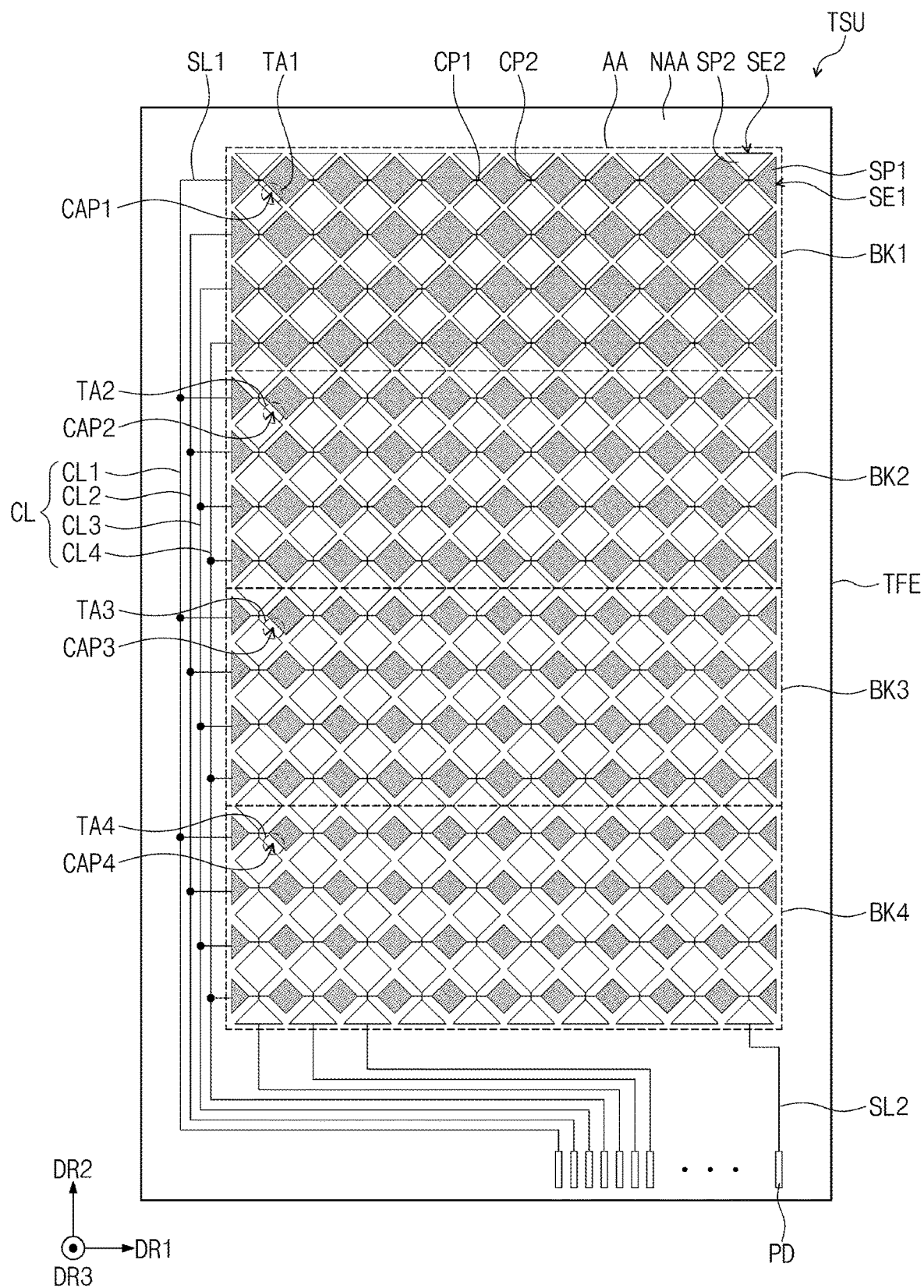
FIG. 17 is a view illustrating a touch sensing operation of a touch sensing unit according to some exemplary embodiments.

FIG. 17 is a view illustrating a touch sensing operation of a touch sensing unit according to some exemplary embodiments.

Referring to FIG. 17, a user may touch (or otherwise interact with) the touch sensing unit TSU. A user may touch one of various areas of the touch sensing unit TSU or may touch at least two or more areas at the same time. For example, a user may touch a first touch area TA1, a second touch area TA2, a third touch area TA3, and/or a fourth touch area TA4.

Since the k-th connection line is connected to the k-th first sensing electrodes SE1 of the first to fourth blocks BK1 to BK4, a method for distinguishing positions of the first sensing electrodes SE1 connected to the k-th connection line may be utilized. Hereinafter, a touch operation when "k" is 1 will be described as an example.

The first touch area TA1 may include a portion of the first sensing electrode SE1 of the first block BK1 that is connected to the first connection line CL1. The second touch area TA2 may include a portion of the first sensing electrode SE1 of the second block BK2 that is connected to the first connection line CL1. The third touch area TA3 may include a portion of the first sensing electrode SE1 of the third block BK3 that is connected to the first connection line CL1. The fourth touch area TA4 may include a portion of the first sensing electrode SE1 of the fourth block BK4 that is connected to the first connection line CL1.

The first capacitance CAP1 may be formed in the first touch area TA1, the second capacitance CAP2 may be formed in the second touch area TA2, the third capacitance CAP3 may be formed in the third touch area TA3, and the fourth capacitance CAP4 may be formed in the fourth touch area TA4. Since the first, second, third, and fourth capacitances CAP1, CAP2, CAP3, and CAP4 of the first, second, third and fourth touch areas TA1, TA2, TA3, and TA4 are different from each other, the positions of the first, second, third and fourth touch areas TA1, TA2, TA3, and TA4 may be distinguished from each other or recognized differently from each other when a user touches the first, second, third, and/or fourth touch areas TA1, TA2, TA3, and TA4.

A single touch operation of the touch sensing unit TSU when a user touches one touch area will be described hereinafter.

When a user touches the first touch area TA1, the first touch area TA1 may be sensed by the first capacitance CAP1. Since the first capacitance CAP1 of the first touch area TA1 is different from the second, third, and fourth capacitances CAP2, CAP3, and CAP4 of the second, third, and fourth touch areas TA2, TA3 and TA4, a signal output through the first connection line CL1 may be a signal corresponding to the first capacitance CAP1.

When a user touches the second touch area TA2, the second touch area TA2 may be sensed by the second capacitance CAP2. Since the second capacitance CAP2 of the second touch area TA2 is different from the first, third, and fourth capacitances CAP1, CAP3, and CAP4 of the first, third, and fourth touch areas TA1, TA3, and TA4, a signal output through the first connection line CL1 may be a signal corresponding to the second capacitance CAP2.

When a user touches the third touch area TA3, the third touch area TA3 may be sensed by the third capacitance CAP3. Since the third capacitance CAP3 of the third touch area TA3 is different from the first, second, and fourth capacitances CAP1, CAP2, and CAP4 of the first, second, and fourth touch areas TA1, TA2, and TA4, a signal output through the first connection line CL1 may be a signal corresponding to the third capacitance CAP3.

When a user touches the fourth touch area TA4, the fourth touch area TA4 may be sensed by the fourth capacitance CAP4. Since the fourth capacitance CAP4 of the fourth touch area TA4 is different from the first, second, and third capacitances CAP1, CAP2, and CAP3 of the first, second, and third touch areas TA1, TA2 and TA3, a signal output through the first connection line CL1 may be a signal corresponding to the fourth capacitance CAP4.

The sensed signals of the first, second, third, and fourth touch areas TA1, TA2, TA3 and TA4 may be provided to a sensing signal processing unit (not shown) through the first connection line CL1. Since the first, second, third, and fourth capacitances CAP1, CAP2, CAP3, and CAP4 are different from each other, the sensing signal processing unit may recognize the sensed signals of the first, second, third, and fourth touch areas TA1, TA2, TA3, and TA4 as different positions from each other.

A multi-touch operation of the touch sensing unit TSU when a user touches at least two or more touch areas at the same time will be described hereinafter. For example, the multi-touch operation when two touch areas are touched at the same time will be described. Two of the first, second, third, and fourth touch areas TA1, TA2, TA3, and TA4 may be touched at the same time.

In the following Table 1, the first, second, third, and fourth touch areas TA1, TA2, TA3, and TA4 of a first row and the first, second, third, and fourth touch areas TA1, TA2, TA3, and TA4 of a first column may mean areas capable of being touched at the same time. Numerical values shown in the following Table 1 may be values of capacitances, a unit of the numerical values may be picofarads (pF). Numerical values in parentheses show touch capacitances of the first, second, third, and fourth touch areas TA1, TA2, TA3, and TA4, and other numerical values show sums of capacitances. There is no case where the same touch area is touched at the same time, and, thus, a space corresponding to the same touch area is empty in the following Table 1. For example, a space corresponding to a N-th row and a N-th column is empty in the following Table 1. Here, "N" is a natural number.

TABLE 1

|  | TA1(1.0) | TA2(0.55) | TA3(0.33) | TA4(0.20) |
|---|---|---|---|---|
| TA1(1.00) |  | 1.50 | 1.33 | 1.20 |
| TA2(0.55) | 1.50 |  | 0.83 | 0.70 |
| TA3(0.33) | 1.33 | 0.83 |  | 0.53 |
| TA4(0.22) | 1.20 | 0.70 | 0.53 |  |

Referring to Table 1, when the first and second touch areas TA1 and TA2 are touched at the same time, a sum of the capacitances of the first and second touch areas TA1 and TA2 may be a capacitance value of a third row and a second column or a capacitance value of a second row and a third column. Thus, a signal output through the first connection line CL1 may be a signal corresponding to a capacitance of 1.50 pF.

When the first and third touch areas TA1 and TA3 are touched at the same time, a sum of the capacitances of the first and third touch areas TA1 and TA3 may be a capacitance value of a fourth row and the second column or a capacitance value of the second row and a fourth column. Thus, a signal output through the first connection line CL1 may be a signal corresponding to a capacitance of 1.33 pF.

When the first and fourth touch areas TA1 and TA4 are touched at the same time, a sum of the capacitances of the first and fourth touch areas TA1 and TA4 may be a capacitance value of a fifth row and the second column or a capacitance value of the second row and a fifth column.

Thus, a signal output through the first connection line CL1 may be a signal corresponding to a capacitance of 1.20 pF.

Even though two touch areas are touched at the same time, the signal output through the first connection line CL1 may be changed depending on positions of the touch areas. The touch of the first and second touch areas TA1 and TA2, the touch of the first and third touch areas TA1 and TA3, and the touch of the first and fourth touch areas TA1 and TA4 were described above as examples. However, even though other two touch areas are touched, a sum of capacitances may be changed depending on touch positions, as can be appreciated from Table 1. Since the sums of the capacitances are different from each other, the sensing signal processing unit may recognize the signals, output through the first connection line CL1, as different signals from each other.

The sensing signal processing unit may recognize that the first and second touch areas TA1 and TA2 are touched when receiving the signal corresponding to the capacitance of 1.50 pF. The sensing signal processing unit may recognize that the first and third touch areas TA1 and TA3 are touched when receiving the signal corresponding to the capacitance of 1.33 pF. The sensing signal processing unit may recognize that the first and fourth touch areas TA1 and TA4 are touched when receiving the signal corresponding to the capacitance of 1.20 pF. In other words, even though two touch areas are touched at the same time, the sum of the capacitances may be changed depending on the touch positions. Thus, two touch areas may be just as easily sensed and distinguished from one another as one touch area.

Figure 18:
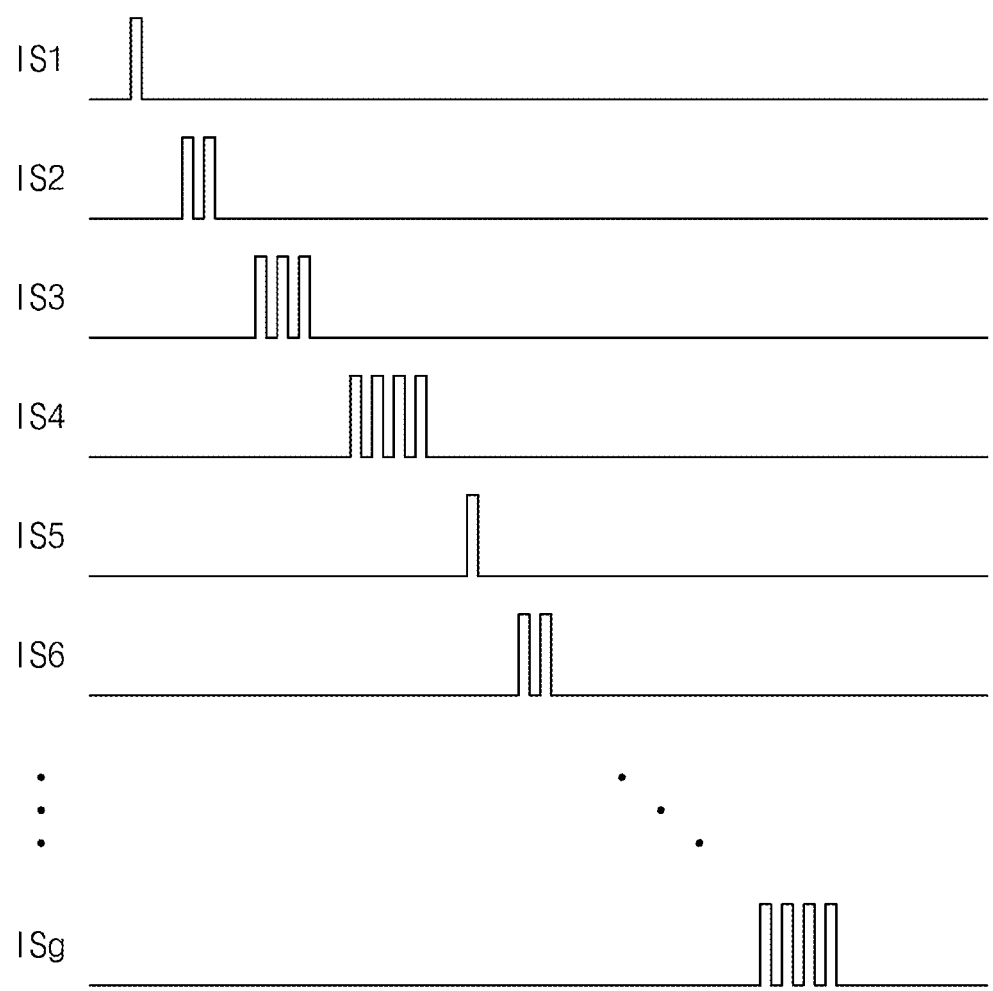
FIG. 18 is a timing diagram of input signals applied to second signal lines illustrated in FIG. 9 according to some exemplary embodiments.

FIG. 18 is a timing diagram of input signals applied to second signal lines illustrated in FIG. 9 according to some exemplary embodiments.

Referring to FIG. 18, a plurality of input signals IS1 to ISg may be applied to the second signal lines SL2, respectively. Here, "g" is a natural number. The input signals IS1 to ISg may be sequentially applied to the second signal lines SL2, respectively. The input signals IS1 to ISg applied to the second signal lines SL2 may be applied to the second sensing electrodes SE2 through the second signal lines SL2. Positions of X coordinates of the second sensing electrodes SE2 may be sensed by the input signals IS1 to ISg.

Each of the input signals IS1 to ISg may include at least one pulse. The number of the pulse(s) of the input signal applied to a q-th second signal line SL2 may be different from the number of the pulse(s) of the input signal applied to a (q+1)-th second signal line SL2. Here, "q" is a natural number. Since the numbers of the pulses of the input signals applied to two second signal lines SL2 adjacent to each other are different from each other, X coordinates of the two second signal lines SL2 adjacent to each other may be accurately distinguished from each other.

In exemplary some embodiments, as the order of the input signals IS1 to ISg increases, the numbers of the pulses of the input signals IS1 to ISg may repeatedly increase sequentially from 1 to f Here, "f" is a natural number greater than 1 and less than or equal to "g" corresponding to the number of the input signals. For example, when "f" is 4, the numbers of the pulses of first to fourth input signals IS1 to IS4 may increase sequentially from 1 to 4, and the numbers of the pulses may repeatedly increase from a fifth input signal IS5 in the same pattern.

Although not shown in the drawings, when "f" is 2, the numbers of the pulses may repeatedly increase sequentially from 1 to 2. When "f" is 3, the numbers of the pulses may repeatedly increase sequentially from 1 to 3. When "f" is equal to "g," as the order of the input signals IS1 to ISg increases, the numbers of the pulses of the input signals IS1 to ISg may increase sequentially from the first input signal IS1 to the last (or g-th) input signal ISg.

As a result, the touch sensing unit TSU according to various exemplary embodiments may reduce the size of the non-active area NAA and may reduce the number of the pads PD, and, thus, the manufacturing cost and/or time of the display device DD may be reduced. In addition, in the touch sensing unit TSU according to various exemplary embodiments, the capacitances formed by the first sensing electrodes SE1 connected to the same connection line may be set differently from each other, and the numbers of the pulses of the input signals applied to the second signal lines SL2 adjacent to each other may be set differently from each other. Thus, the touch position may be accurately sensed.

Figure 19:
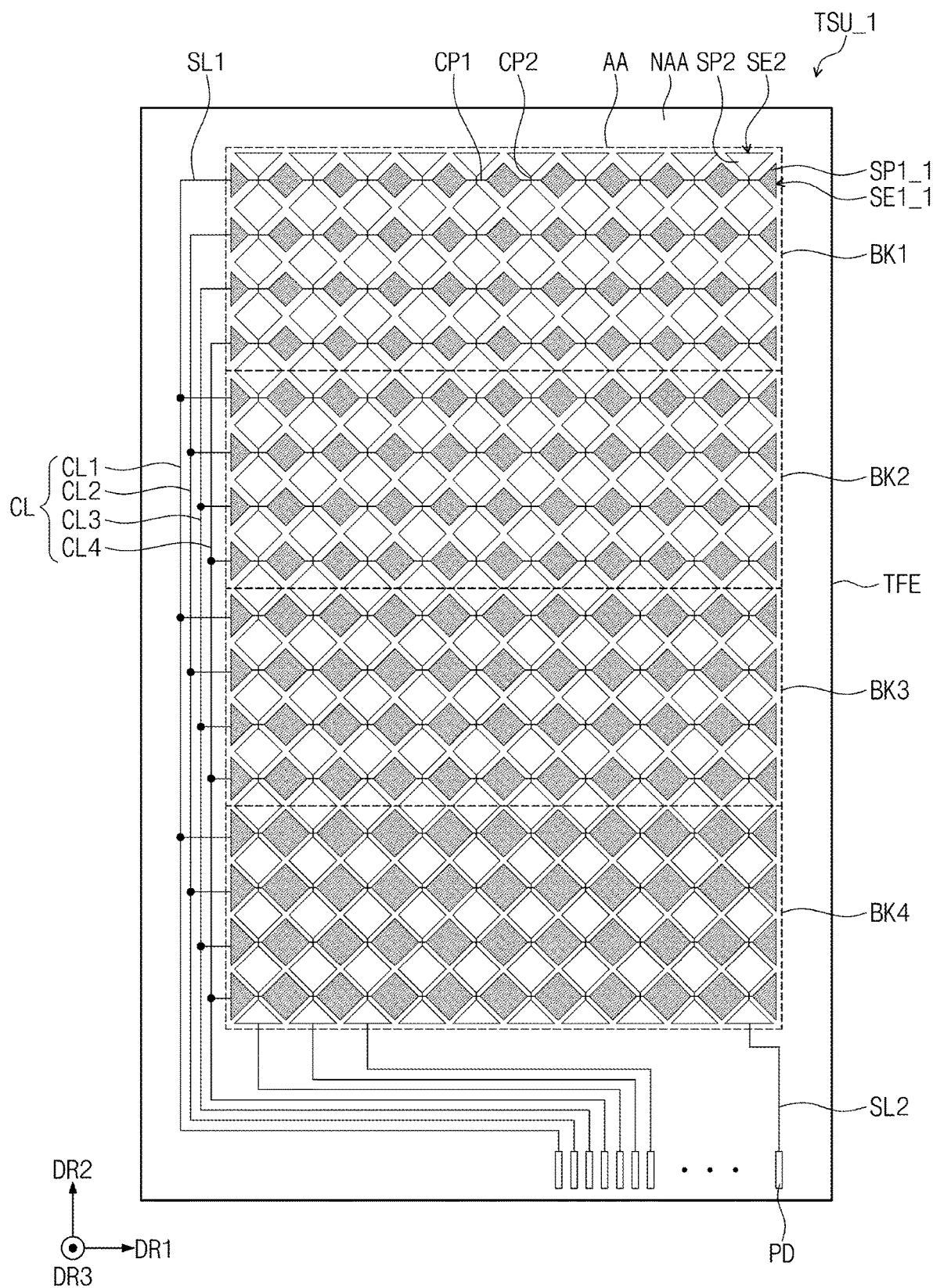
FIGS. 19 and 20 are plan views illustrating components of first sensing electrodes according to various exemplary embodiments.
Figure 20:
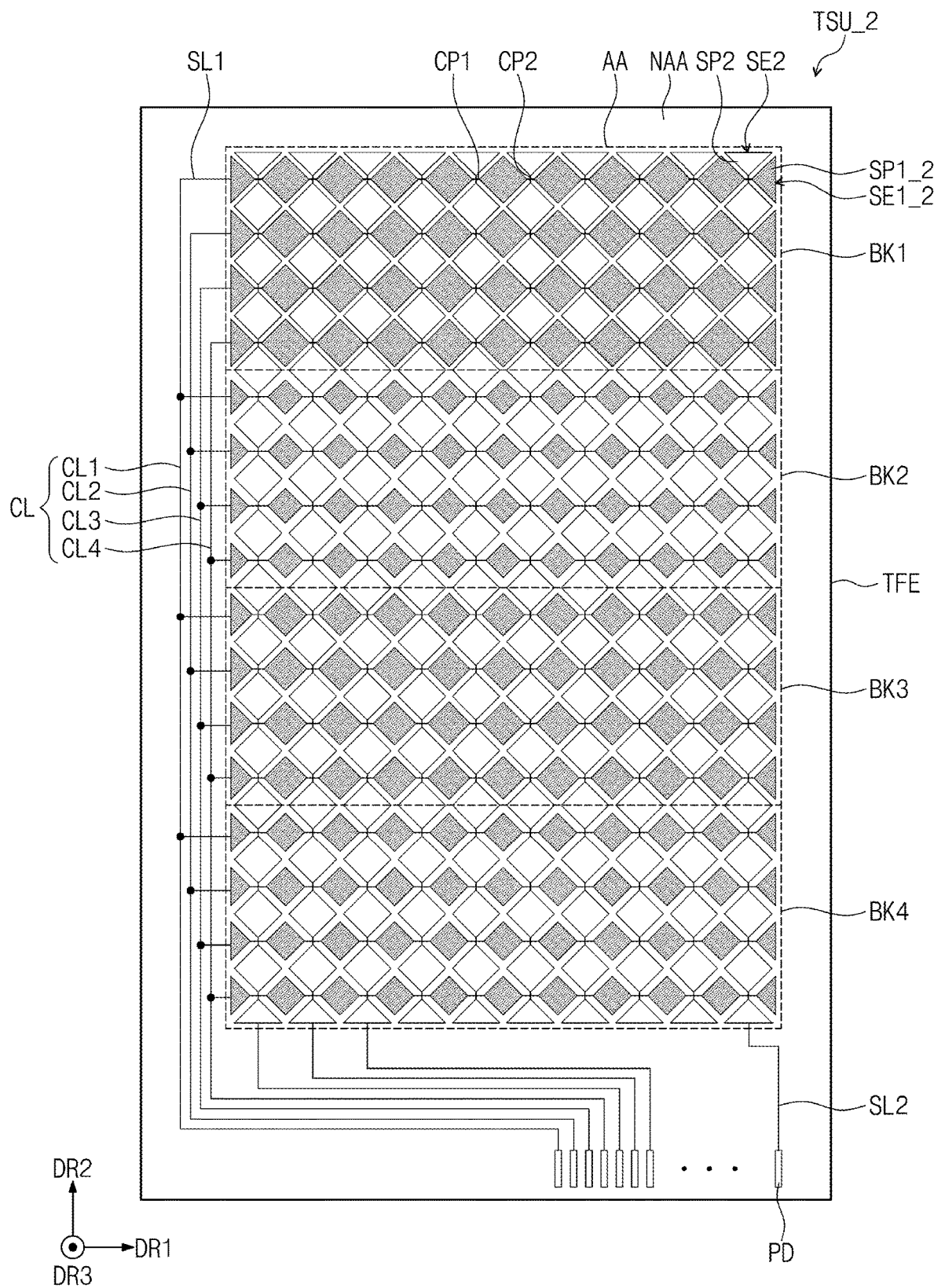

FIGS. 19 and 20 are plan views illustrating components of first sensing electrodes according to some exemplary embodiments.

Except for components of first sensing electrodes SE1_1 and SE1_2, other components of touch sensing units TSU_1 and TSU_2 may be substantially the same as corresponding components of the touch sensing unit TSU illustrated in FIG. 9. Thus, hereinafter, the first sensing electrodes SE1_1 and SE1_2 will be mainly described, and the same components as previously described are indicated by the same reference designators.

Referring to FIG. 19, sizes of the first sensing electrodes SE1_1 of the h-th block of the blocks BK1 to BK4 may be different from sizes of the first sensing electrodes SE1_1 of the (h+1)-th block of the blocks BK1 to BK4. For example, the sizes of the first sensing electrodes SE1_1 of the h-th block may be less than the sizes of the first sensing electrodes SE1_1 of the (h+1)-th block. Thus, the sizes of the first sensing electrodes SE1_1 may increase sequentially from the first block BK1 to the fourth block BK4.

Sizes of first sensor portions SP_1 of the h-th block may be different from sizes of first sensor portions SP1_1 of the (h+1)-th block. For example, the sizes of the first sensor portions SP1_1 of the h-th block may be less than the sizes of the first sensor portions SP1_1 of the (h+1)-th block. Thus, the sizes of the first sensor portions SP1_1 may increase sequentially from the first block BK1 to the fourth block BK4. In addition, a distance between the first and second sensor portions SP1_1 and SP2 adjacent to each other in the h-th block may be greater than a distance between the first and second sensor portions SP1_1 and SP2 adjacent to each other in the (h+1)-th block.

Referring to FIG. 20, sizes of the first sensing electrodes SE1_2 of the h-th block of the blocks BK1 to BK4 may be different from sizes of the first sensing electrodes SE1_2 of the (h+1)-th block of the blocks BK1 to BK4. The sizes of the first sensing electrodes SE1 may decrease sequentially in FIG. 9, and the sizes of the first sensing electrodes SE1_1 may increase sequentially in FIG. 19. However, the sizes of the first sensing electrodes SE1_2 illustrated in FIG. 20 may not decrease or increase sequentially.

For example, the sizes of the first sensing electrodes SE1_2 of the first block BK1 may be greater than the sizes of the first sensing electrodes SE1_2 of the second block BK2. The sizes of the first sensing electrodes SE1_2 of the second block BK2 may be less than the sizes of the first sensing electrodes SE1_2 of the third block BK3. The sizes of the first sensing electrodes SE1_2 of the third block BK3 may be greater than the sizes of the first sensing electrodes SE1_2 of the fourth block BK4. The sizes of the first sensing electrodes SE1_2 of the fourth block BK4 may be greater than the sizes of the first sensing electrodes SE1_2 of the second block BK2.

Figure 21:
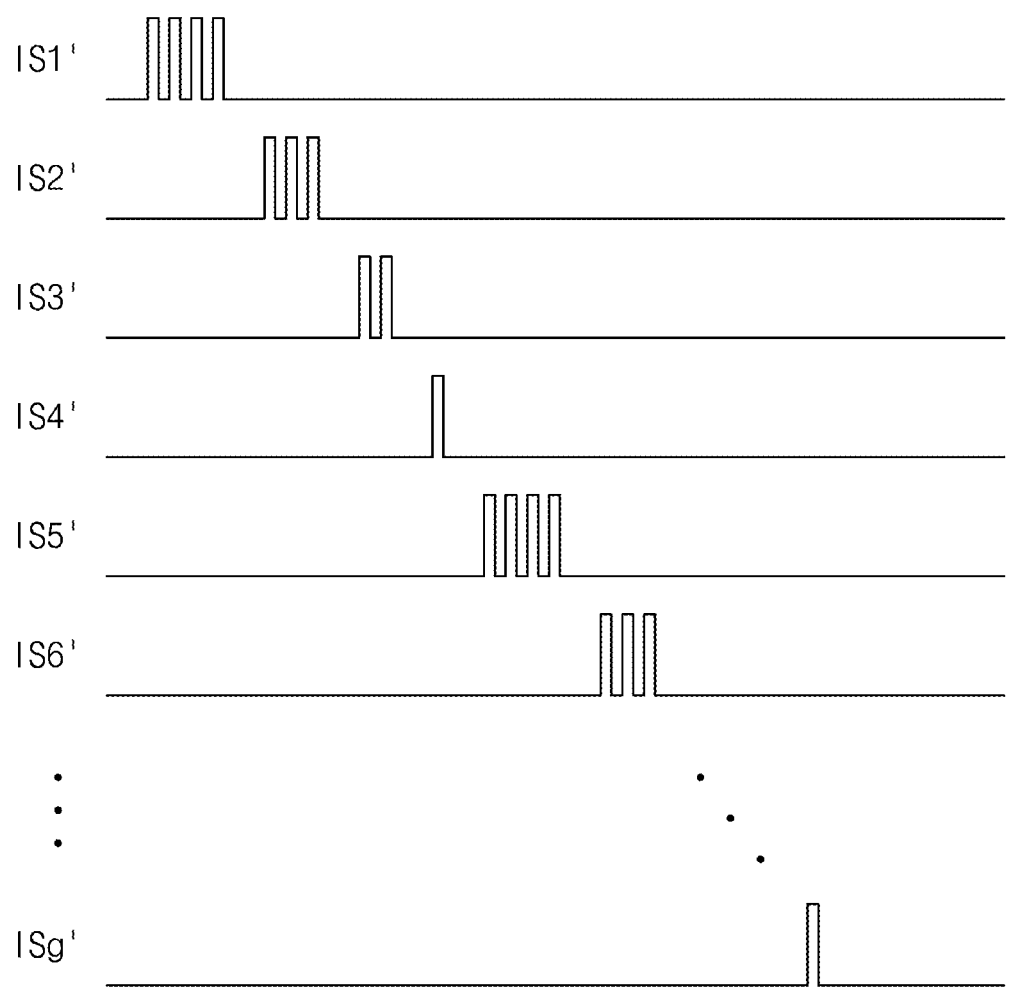
FIG. 21 is a timing diagram of input signals according to some exemplary embodiments.

FIG. 21 is a timing diagram of input signals according to some exemplary embodiments.

Referring to FIG. 21, a plurality of input signals IS1' to ISg' may be applied to the second signal lines SL2, respectively. The input signals IS1' to ISg' may be sequentially applied to the second signal lines SL2, respectively.

Each of the input signals IS1' to ISg' may include at least one pulse. The number of the pulse(s) of the input signal applied to a q-th second signal line SL2 may be different from the number of the pulse(s) of the input signal applied to a (q+1)-th second signal line SL2.

Unlike the input signals IS1 to ISg illustrated in FIG. 18, the numbers of the pulses of the input signals IS1' to ISg' may repeatedly decrease sequentially from f to 1 as the order of the input signals IS1' to ISg' increases. For example, when "f" is 4, the numbers of the pulses of first to fourth input signals IS1' to IS4' may decrease sequentially from 4 to 1, and the numbers of the pulses may repeatedly decrease from a fifth input signal IS5' in the same pattern.

According to various exemplary embodiments, the number of the lines of the touch sensing unit may be reduced, and, thus, the size of the non-active area may be reduced and the number of the pads may be reduced. As a result, the manufacturing cost and/or time of the display device may be reduced. In addition, capacitances formed by the first sensing electrodes connected to the same connection line may be set differently from each other, and the numbers of the pulses of the input signals applied to the second signal lines adjacent to each other may be set differently from each other. Thus, the touch position may be accurately sensed.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A touch sensing unit comprising:
    first sensing electrodes extending in a first direction and arranged in a second direction intersecting the first direction;
    second sensing electrodes extending in the second direction and arranged in the first direction;
    first signal lines connected to the first sensing electrodes, respectively;
    second signal lines connected to the second sensing electrodes, respectively; and
    connection lines connected to the first sensing electrodes via the first signal lines,
    wherein the first sensing electrodes are grouped into a plurality of blocks,
    wherein the plurality of blocks include at least three (3) blocks,
    wherein each of the plurality of blocks comprises:
    p first sensing electrodes of the first sensing electrodes; and
    p first signal lines connected to the p first sensing electrodes, respectively, "p" being a natural number greater than one (1), and
    wherein:
    a k-th connection line of the connection lines is connected to one of the first sensing electrodes of each of the plurality of blocks, "k" being a natural number;
    the first sensing electrodes connected to the k-th connection line form capacitances with the second sensing electrodes; and
    the capacitances of the plurality of blocks are different from each other.

2. The touch sensing unit of claim 1, wherein the k-th connection line is connected to a k-th first sensing electrode of the first sensing electrodes of each of the plurality of blocks via a k-th first signal line of the first signal lines of each of the plurality of blocks.

3. The touch sensing unit of claim 2, wherein:
    the capacitances decrease sequentially from a first block to a last block of the plurality of blocks; and
    sizes of the first sensing electrodes connected to the k-th connection line decrease sequentially from the first block to the last block.

4. The touch sensing unit of claim 2, wherein:
    the capacitances increase sequentially from a first block to a last block of the plurality of blocks; and
    sizes of the first sensing electrodes connected to the k-th connection line increase sequentially from the first block to the last block.

* * * * *